United States Patent
Uzoh et al.

(10) Patent No.: US 11,158,573 B2
(45) Date of Patent: Oct. 26, 2021

(54) INTERCONNECT STRUCTURES

(71) Applicant: Invensas Bonding Technologies, Inc., San Jose, CA (US)

(72) Inventors: Cyprian Emeka Uzoh, San Jose, CA (US); Gaius Gillman Fountain, Jr., Youngsville, NC (US); Jeremy Alfred Theil, Mountain View, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 43 days.

(21) Appl. No.: 16/657,696

(22) Filed: Oct. 18, 2019

(65) Prior Publication Data

US 2020/0126906 A1  Apr. 23, 2020

Related U.S. Application Data

(60) Provisional application No. 62/748,653, filed on Oct. 22, 2018, provisional application No. 62/902,207, filed on Sep. 18, 2019.

(51) Int. Cl.
*H01L 23/48* (2006.01)
*H01L 23/522* (2006.01)
(Continued)

(52) U.S. Cl.
CPC ........ *H01L 23/5226* (2013.01); *H01L 23/298* (2013.01); *H01L 23/3178* (2013.01); *H01L 24/20* (2013.01)

(58) Field of Classification Search
CPC ............. H01L 23/3178; H01L 23/5226; H01L 21/2007; H01L 21/76251
(Continued)

(56) References Cited

U.S. PATENT DOCUMENTS 4,612,083 A   9/1986  Yasumoto et al.
4,818,728 A   4/1989  Rai et al.
(Continued)

FOREIGN PATENT DOCUMENTS

CN   105140144 A   12/2015
CN   106653720 A    5/2017
(Continued)

OTHER PUBLICATIONS

International Search Report and Written Opinion, dated Mar. 25, 2020, for PCT Application No. PCT/US2019/057252, dated Oct. 21, 2019, 12 pages.
(Continued)

*Primary Examiner* — Nitin Parekh
(74) *Attorney, Agent, or Firm* — Knobbe, Martens, Olson & Bear, LLP

(57) ABSTRACT

Representative techniques and devices, including process steps may be employed to mitigate undesired dishing in conductive interconnect structures and erosion of dielectric bonding surfaces. For example, an embedded layer may be added to the dished or eroded surface to eliminate unwanted dishing or voids and to form a planar bonding surface. Additional techniques and devices, including process steps may be employed to form desired openings in conductive interconnect structures, where the openings can have a predetermined or desired volume relative to the volume of conductive material of the interconnect structures. Each of these techniques, devices, and processes can provide for the use of larger diameter, larger volume, or mixed-sized conductive interconnect structures at the bonding surface of bonded dies and wafers.

26 Claims, 15 Drawing Sheets

(51) Int. Cl.
  *H01L 23/00* (2006.01)
  *H01L 23/29* (2006.01)
  *H01L 23/31* (2006.01)

(58) Field of Classification Search
  USPC .................. 257/774; 438/455–456
  See application file for complete search history.

(56) References Cited

U.S. PATENT DOCUMENTS

| | | | |
|---|---|---|---|
| 4,904,328 A | 2/1990 | Beecher et al. |
| 4,939,568 A | 7/1990 | Kato et al. |
| 4,998,665 A | 3/1991 | Hayashi |
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,419,806 A | 5/1995 | Huebner |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,504,376 A | 4/1996 | Sugahara et al. |
| 5,516,727 A | 5/1996 | Broom |
| 5,563,084 A | 10/1996 | Ramm et al. |
| 5,610,431 A | 3/1997 | Martin |
| 5,696,406 A | 12/1997 | Ueno |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,054,363 A | 4/2000 | Sakaguchi et al. |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,123,825 A | 9/2000 | Uzoh et al. |
| 6,147,000 A | 11/2000 | You et al. |
| 6,183,592 B1 | 2/2001 | Sylvester |
| 6,218,203 B1 | 4/2001 | Khoury et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,322,600 B1 | 11/2001 | Brewer et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,359,235 B1 | 3/2002 | Hayashi |
| 6,374,770 B1 | 4/2002 | Lee |
| 6,409,904 B1 | 6/2002 | Uzoh et al. |
| 6,423,640 B1 | 7/2002 | Lee et al. |
| 6,465,892 B1 | 10/2002 | Suga |
| 6,515,343 B1 | 2/2003 | Shroff et al. |
| 6,528,894 B1 | 3/2003 | Akram et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,593,645 B2 | 7/2003 | Shih et al. |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,642,081 B1 | 11/2003 | Patti |
| 6,656,826 B2 | 12/2003 | Ishimaru |
| 6,660,564 B2 | 12/2003 | Brady |
| 6,667,225 B2 | 12/2003 | Hau-Riege et al. |
| 6,720,212 B2 | 4/2004 | Robl et al. |
| 6,759,738 B1 | 7/2004 | Fallon et al. |
| 6,828,686 B2 | 12/2004 | Park |
| 6,837,979 B2 | 1/2005 | Uzoh et al. |
| 6,847,527 B2 | 1/2005 | Sylvester et al. |
| 6,864,585 B2 | 3/2005 | Enquist |
| 6,867,073 B1 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,960,492 B1 | 11/2005 | Miyamoto |
| 6,962,835 B2 | 11/2005 | Tong et al. |
| 6,974,769 B2 | 12/2005 | Basol et al. |
| 7,037,755 B2 | 5/2006 | Enquist |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,109,092 B2 | 9/2006 | Tong |
| 7,126,212 B2 | 10/2006 | Enquist et al. |
| 7,193,239 B2 | 3/2007 | Leedy |
| 7,193,423 B1 | 3/2007 | Dalton et al. |
| 7,247,948 B2 | 7/2007 | Hedler et al. |
| 7,335,572 B2 | 2/2008 | Tong et al. |
| 7,354,798 B2 | 4/2008 | Pogge et al. |
| 7,385,283 B2 * | 6/2008 | Wu .................... H01L 21/6835 257/686 |
| 7,387,944 B2 | 6/2008 | Tong et al. |
| 7,485,968 B2 | 2/2009 | Enquist et al. |
| 7,553,744 B2 | 6/2009 | Tong et al. |
| 7,750,488 B2 | 7/2010 | Patti et al. |
| 7,803,693 B2 | 9/2010 | Trezza |
| 7,807,549 B2 | 10/2010 | Tong et al. |
| 7,998,335 B2 | 8/2011 | Feeney et al. |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 * | 4/2014 | Sadaka .............. H01L 23/3178 438/108 |
| 8,716,105 B2 | 5/2014 | Sadaka et al. |
| 8,802,538 B1 | 8/2014 | Liu |
| 8,809,123 B2 * | 8/2014 | Liu .................... H01L 25/0657 438/118 |
| 8,841,002 B2 | 9/2014 | Tong |
| 8,916,448 B2 | 12/2014 | Cheng et al. |
| 8,988,299 B2 | 3/2015 | Kam et al. |
| 9,040,385 B2 | 5/2015 | Chen et al. |
| 9,064,937 B2 | 6/2015 | Edelstein et al. |
| 9,082,627 B2 | 7/2015 | Tong et al. |
| 9,093,350 B2 | 7/2015 | Endo et al. |
| 9,142,517 B2 | 9/2015 | Liu |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,032 B2 | 5/2016 | Liu et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,343,369 B2 | 5/2016 | Du et al. |
| 9,368,866 B2 | 6/2016 | Yu |
| 9,385,024 B2 | 7/2016 | Tong et al. |
| 9,394,161 B2 | 7/2016 | Cheng et al. |
| 9,425,155 B2 | 8/2016 | Liu et al. |

(56) References Cited

U.S. PATENT DOCUMENTS

| | | | |
|---|---|---|---|
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,075 B1 | 1/2017 | Baloglu et al. |
| 9,559,081 B1 | 1/2017 | Lai et al. |
| 9,620,481 B2 | 4/2017 | Edelstein et al. |
| 9,656,852 B2 | 5/2017 | Cheng |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,859,254 B1 | 1/2018 | Yu et al. |
| 9,865,581 B2 | 1/2018 | Jang et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,129 B2 * | 5/2018 | Liu ............... H01L 21/76834 |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,103,122 B2 | 10/2018 | Liu et al. |
| 10,147,641 B2 | 12/2018 | Enquist et al. |
| 10,204,893 B2 | 2/2019 | Uzoh et al. |
| 10,211,166 B2 | 2/2019 | Matsuo |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,312,275 B2 | 6/2019 | Hynecek |
| 10,431,614 B2 | 10/2019 | Gambino et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,840,205 B2 | 11/2020 | Fountain, Jr. et al. |
| 2002/0000328 A1 | 1/2002 | Motomura et al. |
| 2002/0003307 A1 | 1/2002 | Suga |
| 2002/0025665 A1 | 2/2002 | Juengling |
| 2002/0074670 A1 | 6/2002 | Suga |
| 2002/0094661 A1 | 7/2002 | Enquist et al. |
| 2002/0113241 A1 | 8/2002 | Kubota et al. |
| 2003/0092220 A1 | 5/2003 | Akram |
| 2003/0109083 A1 | 6/2003 | Ahmad |
| 2003/0129796 A1 | 7/2003 | Bruchhaus et al. |
| 2003/0157748 A1 | 8/2003 | Kim et al. |
| 2004/0084414 A1 | 5/2004 | Sakai et al. |
| 2004/0157407 A1 | 8/2004 | Tong et al. |
| 2004/0217483 A1 | 11/2004 | Hedler et al. |
| 2004/0262772 A1 | 12/2004 | Ramanathan et al. |
| 2005/0104224 A1 | 5/2005 | Huang et al. |
| 2005/0181542 A1 | 8/2005 | Enquist |
| 2006/0024950 A1 | 2/2006 | Choi et al. |
| 2006/0057945 A1 | 3/2006 | Hsu et al. |
| 2007/0045780 A1 * | 3/2007 | Akram ............... H01L 25/0657 |
| | | 257/621 |
| 2007/0096294 A1 | 5/2007 | Ikeda et al. |
| 2007/0111386 A1 | 5/2007 | Kim et al. |
| 2007/0145367 A1 * | 6/2007 | Chen ............... H01L 25/50 |
| | | 257/49 |
| 2007/0212870 A1 | 9/2007 | Yang et al. |
| 2007/0222048 A1 | 9/2007 | Huang |
| 2007/0295456 A1 | 12/2007 | Gudeman et al. |
| 2008/0073795 A1 | 3/2008 | Kohl et al. |
| 2008/0122092 A1 | 5/2008 | Hong |
| 2009/0140404 A1 * | 6/2009 | Chen ............... H01L 25/50 |
| | | 257/678 |
| 2009/0197408 A1 | 8/2009 | Lehr et al. |
| 2009/0200668 A1 | 8/2009 | Yang et al. |
| 2010/0164066 A1 | 7/2010 | Di Franco |
| 2010/0261332 A1 * | 10/2010 | Kim ............... H01L 21/02046 |
| | | 438/455 |
| 2011/0074040 A1 | 3/2011 | Frank et al. |
| 2011/0290552 A1 | 12/2011 | Palmateer et al. |
| 2012/0013013 A1 | 1/2012 | Sadaka et al. |
| 2012/0068355 A1 * | 3/2012 | Aoki ............... H01L 25/50 |
| | | 257/774 |
| 2012/0211894 A1 | 8/2012 | Aoyagi |
| 2012/0212384 A1 | 8/2012 | Kam et al. |
| 2012/0252189 A1 | 10/2012 | Sadaka et al. |
| 2012/0319280 A1 | 12/2012 | Suganuma et al. |
| 2013/0020704 A1 | 1/2013 | Sadaka |
| 2013/0075900 A1 | 3/2013 | Shim et al. |
| 2013/0221527 A1 | 8/2013 | Yang et al. |
| 2013/0256913 A1 | 10/2013 | Black et al. |
| 2013/0307165 A1 | 11/2013 | Wang et al. |
| 2013/0320556 A1 | 12/2013 | Liu et al. |
| 2013/0328186 A1 | 12/2013 | Uzoh et al. |
| 2014/0131869 A1 | 5/2014 | Pendse |
| 2014/0175655 A1 | 6/2014 | Chen et al. |
| 2014/0191418 A1 | 7/2014 | Cheng et al. |
| 2014/0225795 A1 | 8/2014 | Yu |
| 2014/0252635 A1 | 9/2014 | Tran et al. |
| 2014/0264948 A1 | 9/2014 | Chou et al. |
| 2014/0332980 A1 | 11/2014 | Sanders et al. |
| 2015/0064498 A1 | 3/2015 | Tong |
| 2015/0108644 A1 | 4/2015 | Kuang et al. |
| 2015/0155263 A1 | 6/2015 | Farooq et al. |
| 2015/0206823 A1 | 7/2015 | Lin et al. |
| 2015/0214191 A1 | 7/2015 | Lee et al. |
| 2015/0228621 A1 | 8/2015 | Kumar et al. |
| 2016/0049384 A1 | 2/2016 | Lu et al. |
| 2016/0086923 A1 | 3/2016 | Best |
| 2016/0343682 A1 | 11/2016 | Kawasaki |
| 2017/0053897 A1 | 2/2017 | Lai et al. |
| 2017/0062366 A1 | 3/2017 | Enquist |
| 2017/0162535 A1 | 6/2017 | Rinne |
| 2017/0179029 A1 | 6/2017 | Enquist et al. |
| 2017/0194271 A1 | 7/2017 | Hsu et al. |
| 2017/0358551 A1 | 12/2017 | Liu et al. |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0204798 A1 | 7/2018 | Enquist et al. |
| 2018/0219038 A1 | 8/2018 | Gambino et al. |
| 2018/0226371 A1 | 8/2018 | Enquist |
| 2018/0226375 A1 | 8/2018 | Enquist et al. |
| 2018/0240860 A1 | 8/2018 | Yang et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0057756 A1 | 2/2019 | Kim et al. |
| 2019/0088535 A1 | 3/2019 | Yan et al. |
| 2019/0096741 A1 | 3/2019 | Uzoh et al. |
| 2019/0096842 A1 | 3/2019 | Fountain, Jr. et al. |
| 2019/0109042 A1 | 4/2019 | Katkar et al. |
| 2019/0115277 A1 | 4/2019 | Yu et al. |
| 2019/0131277 A1 | 5/2019 | Yang et al. |
| 2019/0157334 A1 | 5/2019 | Wei et al. |
| 2019/0189603 A1 | 6/2019 | Wang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0319007 A1 * | 10/2019 | Uzoh ............... H01L 24/09 |
| 2019/0333550 A1 | 10/2019 | Fisch |
| 2019/0348336 A1 | 11/2019 | Katkar et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035630 A1 | 1/2020 | Kameshima |
| 2020/0075534 A1 | 3/2020 | Gao et al. |
| 2020/0194396 A1 | 6/2020 | Uzoh |

(56) References Cited

U.S. PATENT DOCUMENTS

| | | |
|---|---|---|
| 2020/0227367 A1 | 7/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0365575 A1 | 11/2020 | Uzoh et al. |
| 2020/0371154 A1 | 11/2020 | DeLaCruz et al. |
| 2020/0395321 A1 | 12/2020 | Katkar et al. |
| 2021/0098412 A1 | 4/2021 | Haba et al. |

FOREIGN PATENT DOCUMENTS

| | | |
|---|---|---|
| CN | 106920795 A | 7/2017 |
| CN | 107731668 A | 2/2018 |
| CN | 107993927 A | 5/2018 |
| CN | 107993928 A | 5/2018 |
| CN | 109155301 A | 1/2019 |
| CN | 109417073 A | 3/2019 |
| CN | 109417075 A | 3/2019 |
| CN | 109417077 A | 3/2019 |
| CN | 109643643 A | 4/2019 |
| CN | 109844915 A | 6/2019 |
| EP | 0 465 227 A2 | 1/1992 |
| EP | 2 863 420 A1 | 4/2015 |
| JP | 61-030059 | 2/1986 |
| JP | 01-168040 | 7/1989 |
| JP | 4-259249 | 9/1992 |
| JP | 05-029183 | 2/1993 |
| JP | 5-198739 | 8/1993 |
| JP | 6-13456 | 1/1994 |
| JP | 6-260594 | 9/1994 |
| JP | H07-66093 | 3/1995 |
| JP | H7-249749 | 9/1995 |
| JP | 7-283382 | 10/1995 |
| JP | 8-78645 | 3/1996 |
| JP | 8-125121 | 5/1996 |
| JP | 8-186235 | 7/1996 |
| JP | 9-120979 | 5/1997 |
| JP | 10-135404 | 5/1998 |
| JP | 10-223636 | 8/1998 |
| JP | 10-242383 | 9/1998 |
| JP | 11-186120 | 7/1999 |
| JP | 2000-100679 | 4/2000 |
| JP | 2000-260934 | 9/2000 |
| JP | 2000-299379 | 10/2000 |
| JP | 2000-311982 | 11/2000 |
| JP | 2001-102479 | 4/2001 |
| JP | 2001-326326 | 11/2001 |
| JP | 2002-026123 | 1/2002 |
| JP | 2002-516033 | 5/2002 |
| JP | 2002-353416 | 12/2002 |
| JP | 2002-368159 | 12/2002 |
| JP | 2003-023071 | 1/2003 |
| JP | 2004-200547 | 7/2004 |
| JP | 2005-086089 | 3/2005 |
| JP | 2005-093486 | 4/2005 |
| JP | 2005-135988 | 5/2005 |
| JP | 2013-33786 A | 2/2013 |
| JP | 2013-033900 A | 2/2013 |
| JP | 2018-160519 A | 10/2018 |
| JP | 2019-129199 | 8/2019 |
| KR | 10-2011-0079222 A | 7/2011 |
| KR | 10-2012-0106366 | 9/2012 |
| KR | 10-2015-0097798 | 8/2015 |
| TW | 476145 | 2/2002 |
| WO | WO 01/61743 A1 | 8/2001 |
| WO | WO 03/054954 A2 | 7/2003 |
| WO | 2005-043584 A2 | 5/2005 |
| WO | WO 2006/100444 A1 | 9/2006 |
| WO | WO 2012/013162 A1 | 2/2012 |
| WO | WO 2016/185883 A1 | 11/2016 |
| WO | WO 2017/151442 A1 | 9/2017 |
| WO | WO 2017/155002 A1 | 9/2017 |
| WO | WO 2019/146427 A1 | 8/2019 |

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.

Moriceau, H. et al., "Overview of Recent Direct Wafer Bonding Advances and Applications", Advances in Natural Sciences—Nanoscience and Nanotechnology, 2010, 12 pages.

Nakanishi, H. et al., "Studies on SiO2—SiO2 Bonding with Hydrofluoric Acid. Room Temperature and Low Stress Bonding Technique for MEMS," Tech. Research Lab., 200, Elsevier Science S.A., 8 pages.

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.

Plobi et al., "Wafer Direct Bonding: Tailoring Adhesion Between Brittle Materials," Materials Science and Engineering Review Journal, 1999, 88 pages.

Amirfeiz et al., "Formation of silicon structures by plasma-activated wafer bonding," Journal of the Electrochemical Society, 2000, vol. 147, No. 7, pp. 2693-2698.

Appeal Decision of Rejection dated Apr. 12, 2016 in Japanese Patent Application No. 2008-526104, in 14 pages.

Aspar, B. et al., "The smart-cut process: Status and developments," Proc. Electrochem Soc., 1999, vol. 99-53, pp. 48-59.

Bower, R. et al., "Low temperature Si3N4 direct bonding," Appl. Phys. Lett., Jun. 28, 1993, vol. 62, No. 26, pp. 3485-3487.

Canadian Office Action dated Aug. 1, 2013 in Canadian Patent Application No. 2,618,191, 4 pages.

Canadian Office Action, dated May 16, 2012 for Canadian Patent Application No. 2,515,375, with international preliminary report, 2 pages.

Ceramic Microstructures: Control at the Atomic Level, Recent Progress in Surface Activated Bonding, 1998, pp. 385-389.

"Chemical Mechanical Polishing (CMP) Metrology with Advanced Surface Polisher," Park Systems, 4 pages.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808- 812.

D'Agostino, R., "Plasma etching of Si and SiO2 in SF6-O2 mixtures," J. Appl. Phys., Jan. 1981, vol. 52, No. 1, pp. 162-167.

Decision—Request for Trail Granted, Inter Partes Review, U.S. Pat. No. 7,485,968, Case IPR2013-00381, dated Dec. 18, 2013, in 27 pages.

Declaration of Richard A. Blanchard in Support of Petition for inter partes review of U.S. Pat. No. 7,485,968, dated Jun. 13, 2013, pp. 1-18.

Dysard, Jeffrey M. et al., "CMP solutions for the integration of high-k metal gate technologies," ECS Transactions, 2010, vol. 33, Issue 10, pp. 77-89.

Fan et al., "Copper water bonding," Electrochem. Solid-State Lett., U.S.A., The Electrochemical Society, Aug. 6, 1999, vol. 2, No. 10, pp. 534-536.

Fang, S.J. et al., "Advanced process control in dielectric chemical mechanical polishing (CMP)," Texas Instruments, Silicon Technology Development, 8 pages.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-97, 1995, pp. 72-77.

Final Written Decision, Inter PartesReview, U.S. Pat. No. 7,485,968, Case IPR2013-00381, dated Feb. 27, 2014, in 3 pages.

(56) References Cited

OTHER PUBLICATIONS

Gösele et al., "Semiconductor Wafer Bonding: A flexible approach to materials combinations in microelectronics; micromechanics and optoelectronics," IEEE, 1997, pp. 23-32.

Gösele et al., "Silicon layer transfer by wafer bonding," Proceedings of the Second International Symposium on Semiconductor Wafer Bonding: Science, Technology and Applications, The Electrochemical Society Proceedings, vol. 93-29 (1993), pp. 395-409.

Handbook of Thin Film Technology, Maissel and Glang, 1983 Reissue, pp. 12-24.

Harendt, C. et al., "Vertical polysilicon interconnects by aligned wafer bonding," Electrochemical Society Proceedings, 1998, vol. 97-36, pp. 501-508.

Hayashi, Y. et al., "Fabrication of three-dimensional Ic using cumulatively bonded IC (CUBIC) technology," VSLI Tech. Dog., 1990, pp. 95-96.

Hizukuri, M. et al., "Dynamic strain and chip damage during ultrasonic flip chip bonding," Jpn. J. Appl. Phys. 40, 2001, pp. 3044-3048.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7.

Howlader et al., "Bonding of p-Si/n-InP wafers through surface activated bonding method at room temperature," Indium Phosphide and Related Materials, 2001, IEEE International Conference On, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

"Hybrid Bonding—Patent Landscape Analysis," from Technologies to IP Business Intelligence, KnowMade Patent & Technology Intelligence, www.kmowmade.com, Nov. 2019, 81 pages.

Hymes, S. et al., "Determination of the planarization distance for copper CMP process," 6 pages.

Iida, A. et al., "The study of initial mechanism for Al—Au solid phase diffusion flip-chip bonding," Jpn. J. Appl. Phys. 40, 1997, pp. 3044-3661.

International Search Report and Written Opinion dated Apr. 22, 2019 in International Application No. PCT/US2018/064982, 13 pages.

International Search Report and Written Opinion dated Mar. 7, 2019, in International Application No. PCT/US2018/060044, 14 pages.

International Search Report and Written Opinion, dated Jan. 10, 2019, for PCT Application No. PCT/US2018/051537, 3 pages.

International Search Report and Written Opinion dated Oct. 8, 2019, in International Application No. PCT/US2019/037072, 13 pages.

International Search Report and Written Opinion dated Dec. 6, 2019, in International Application No. PCT/US2019/047513, 12 pages.

Itoh et al., "Characteristics of fritting contacts utilized for micromachined wafer probe cards," 2000 American Institute of Physics, AIP Review of Scientific Instruments, vol. 71, 2000, pp. 2224.

Itoh et al., "Characteristics of low force contact process for MEMS probe cards," Sensors and Actuators A: Physical, Apr. 1, 2002, vols. 97-98, pp. 462-467.

Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.

Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.

Juang, Jing-Ye et al., "Copper-to-copper direct bonding on highly (111)-oriented nanotwinned copper in no-vacuum ambient," Scientific Reports, Sep. 17, 2018, vol. 8, 11 pages.

Kim et al., "Low temperature direct Cu—Cu bonding with low energy ion activation method," Electronic Materials and Packaging, 2001, IEEE, pp. 193-195.

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.

Kim et al., "Wafer-scale activated bonding of Cu—Cu, Cu—Si, and Cu—SiO2 at low temperature," Proceedings—Electrochemical Society, 2003, vol. 19, pp. 239-247.

Kissinger, G. et al., "Void-free silicon-wafer-bond stregthening in the 200-400 C range," Sensors and Actuators A, 1993, vol. 36, pp. 149-156.

Krauter, G. et al., "Low temperature silicon direct bonding for application in micromechanics: bonding energies for different combinations of oxides," Sensors and Actuators A, 1998, vol. 70, pp. 271-275.

Kunio, Takemitsu, "Three dimensional IC technology, using cubic method," Journal of the JWS, Japan Welding Society, Apr. 5, 1994, vol. 63, No. 3, pp. 185-189.

Lee, D. et al., "Slurry components in metal chemical mechanical planarization (CMP) process: A review," International Journal of Precision Engineering and Manufacturing, Dec. 2016, vol. 17, No. 12, pp. 1751-1762.

Li, Yuzhuo, "Key factors that influence step height reduction efficiency and defectivity during metal CMP," Clarkson University, Levitronix CMP Users' Conference 2006, 2006, 32 pages.

Li, Y.A. et al., "Low temperature copper to copper direct bonding," Jpn. Appl. Phys. 37, 1998, pp. L1068-L1069.

Li, Y.A. et al., "Systematic low temperature silicon bonding using pressure and temperature," Jpn. J. Appl. Phys., vol. 37, 1998, pp. 737-741.

Liu, Zi-Yu et al. "Detection and formation mechanism of micro-defects in ultrafine pitch Cu—Cu direct bonding," Chin. Phys. B, 2016, vol. 25, No. 1, pp. 018103-1-018103-7.

Liu, C. et al., "Low-temperature direct copper-to-copper bonding enabled by creep on (111) surfaces of nanotwinned Cu," Scientific Reports, May 12, 2015, 5:09734, pp. 1-11.

Lu, L. et al., "Grain growth and strain release in nanocrystalline copper," Journal of Applied Physics, vol. 89, Issue 11, pp. 6408.

Luo, Ying, "Slurry Chemistry Effects on Copper Chemical Mechanical Planarization," University of Central Florida STARS, Electronic Theses and Disserations, 2004, Paper 36, 111 pages.

Matsuzawa et al., "Room-temperature interconnection of electroplated Au microbump by means of surface activated bonding method," Electornic Components and Technology Confererence, 2001, 51st Proceedings, IEEE, pp. 384-387.

Monsma et al., "Development of the spin-valve transistor," IEEE Tran. Magnet., vol. 33, No. 5, Sep. 1997, pp. 3495-3499.

Mott, D. et al., "Synthesis of size-controlled and shaped copper nanoparticles," Langmuir, 2007, vol. 23, No. 10, pp. 5740-5745.

Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.

Ortleb, Thomas et al., "Controlling macro and micro surface topography for a 45nm copper CMP process using a high resolution profiler," Proc. Of SPIE, 2008, vol. 6922, 11 pages.

Paul, E. et al., "A model of copper CMP," J. Electrochem. Soc., 2005, vol. 152, Issue 4, pp. G322-G328.

Petition for Inter Partes Review of U.S. Pat. No. 7,485,968, IPR 2013-00381, filed Jun. 21, 2013, pp. 1-49.

(56) References Cited

OTHER PUBLICATIONS

Reiche et al., "The effect of a plasma pretreatment on the Si/Si bonding behaviouir," Electrochemical Society Proceedings, 1998, vol. 97-36, pp. 437-444.
Rhoades, Robert L., "The Dark Art of CMP," Future Fab International, Issue 24, 10 pages.
Roberds et al., "Low temperature , in situ, plasma activated wafer bonding," Electrochecmical Society Proceedings, 1997, vol. 97-36, pp. 598-606.
Rosales-Yeomans, D. et al., "Evaluation of pad groove designs under reduced slurry flow rate conditions during copper CMP," Journal of the Electrochemical Society, 2008, vol. 155, No. 10, pp. H812-H818.
Schmidt, Martin A., Wafer-To-Wafer Bonding for Microstructure Formation, Proceedings of the IEEE, vol. 86, No. 8, 1998, pp. 1575-1586.
Shigetou et al., "Cu—Cu direct bonding for bump-less interconnect," Research Center for Advanced Science and Technolog., University of Tokyo, Optoelectronic Packaging and Solder Bumps, (2002), pp. 628-639.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shimatsu, T. et al., "Metal bonding during sputter film deposition," J. Vac. Sci. Technol. A 16(4), 1998, pp. 2125-2131.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Steinkirchner, J. et al., "Silicon wafer bonding via designed monolayers," Advanced Materials, 1995, vol. 7, No. 7, 7 pages.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature bonding of lithium niobate and silicon wafers by argon-beam surface activation," Appl. Phys. Lett., 1999. vol. 74, pp. 2387.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Tong et al., "Low temperature wafer direct bonding," Journal of Microelectromechanical Systems, IEEE Service Center, Piscataway, NJ, vol. 3, No. 1, Mar. 1, 1994, pp. 29-35, XP-000885425, ISSN 1057-7157.
Tong, Q.Y. et al., "Semiconductor wafer bonding," Materials Chemistry and Physics, R25, 1999, 239 pages (exerpts).
Tong, Q.Y. et al., "Semiconductor wafer bonding: recent developments," Materials Chemistry and Physics, vol. 37, 1994, pp. 101-127.
Tong, Q.Y. et al., "Semiconductor wafer bonding: science and technology," 1999, 120 pages.
Tong, Q.Y. et al., "Semiconductor wafer bonding: science and technology," 1999, 159 pages.
Tong, Q.Y. et al., "Wafer bonding and layer splitting for microsystems," Advanced Materials, 1999, vol. 11, No. 17, pp. 1409-1425.
Topol et al., "Enabling technologies for wafer-level bonding of 3D MEMS and integrated circuit structures," 2004 Electronics Components and Technology Conference, 2004 IEEE, pp. 931-938.
Tsau et al., "Fabrication process and plasticity of gold-gold thermocompression bonds," Mater. Soc. Symp. Proc. 605, 171 (1999).
Tsau, C.H. et al., "Characterization of low temperature wafer-level gold-gold thermocompression bonds," Mater. Soc. Symp. Proc. 605, 1999, pp. 171-176.
Vossen, J. et al., "Thin Film Processes II," Academic Press, 1991, 62 pages.
Vossen, J. et al., "Thin Film Processes," Academic Press, 1978, 62 pages.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Warner, K. et al., "Low-temperature oxide-bonded three-dimensional integrated circuits," IEEE International Soi Conference, Oct. 2012, pp. 123-125.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

(56) References Cited

OTHER PUBLICATIONS

Wikipedia, "Chemical bond," URL http://en.wikipedia.org/wiki/chemical_bond, accessed on Mar. 31, 2010, 10 pages.
Wikipedia, "Van der Waals force," URL https://en.wikipedia.org/wiki/Van_der_Waals_force, originally accessed on Mar. 31, 2010, 7 pages.
Xu et al., "New Au—Al interconnect technology and its reliability by surface activated bonding," Electronic Packaging Technology Proceedings, Oct. 28-30, 2003, Shanghai, China, pp. 479-483.
Yablonovitch, E. et al., "Van der Waals bonding of GaAs on Pd leads to a permanent, solid-phase-topotaxial metallurgical bond," Appl. Phys. Lett. 59, 1991, pp. 3159-3161.
Image showing a partial cross-section of Sony IMX260 BSI image sensor from Samsung Galaxy S7; product believed to be released Mar. 2016.
Image showing a partial cross-section of Omnivision OV16B10 16MP BSI image sensor from Huawei P20 Lite Phone; product believed to be released May 2018.

\* cited by examiner

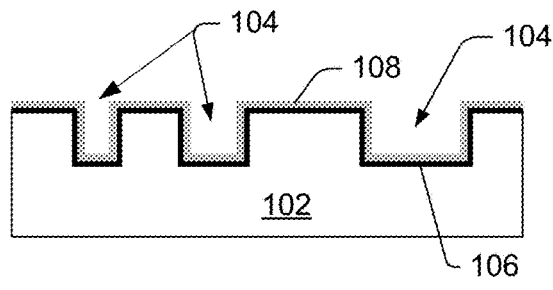 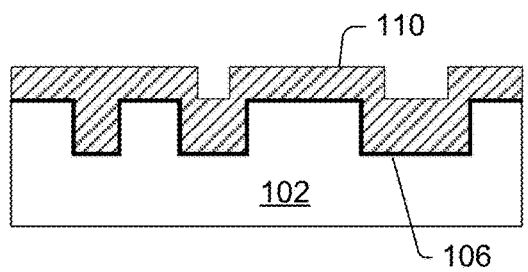
FIG. 1A                FIG. 1B
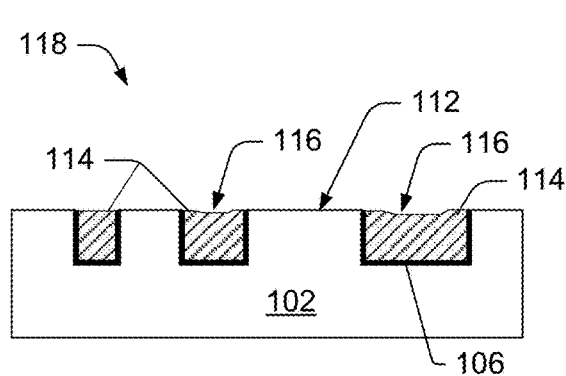 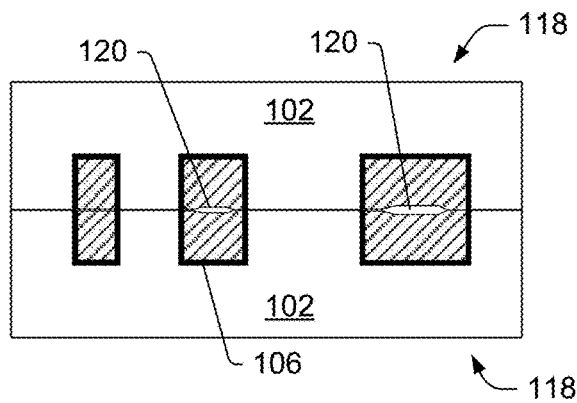
FIG. 1C                FIG. 1D

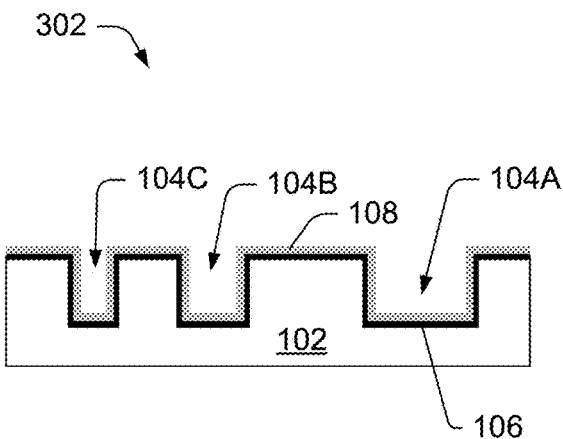
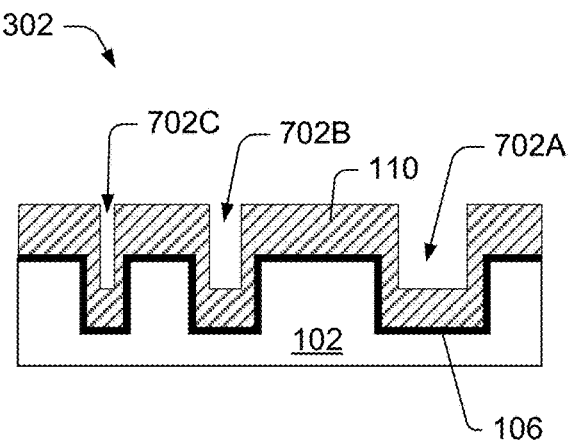
FIG. 7A
FIG. 7B
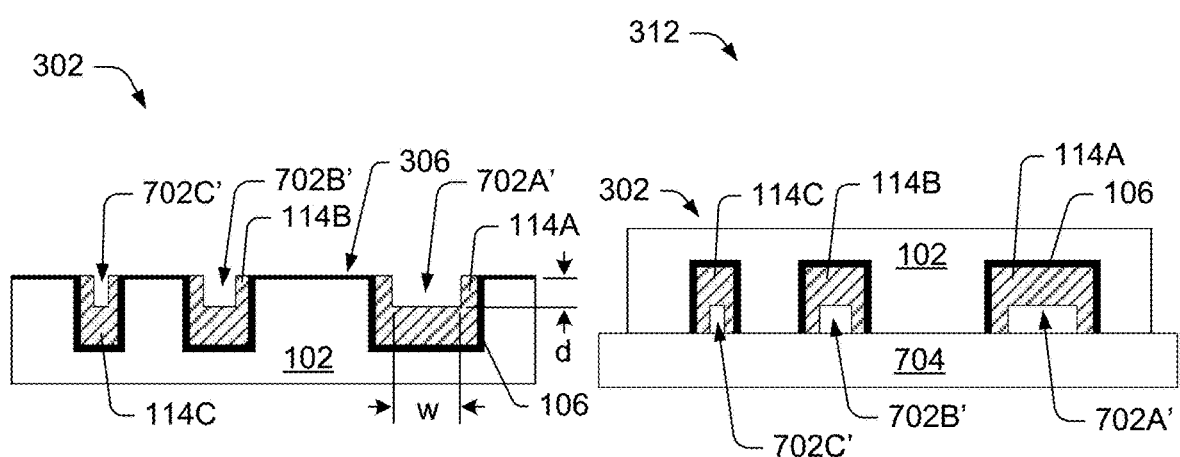
FIG. 7C
FIG. 7D

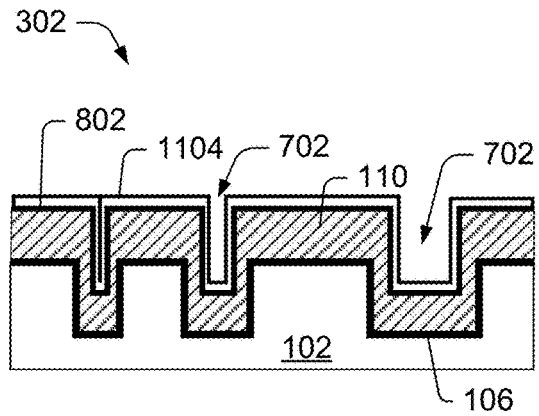
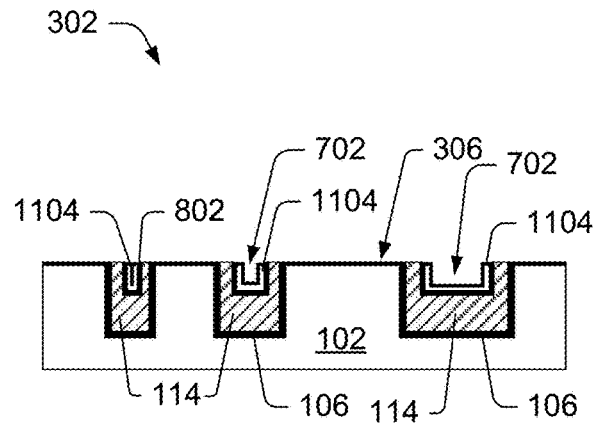
FIG. 11A  FIG. 11B
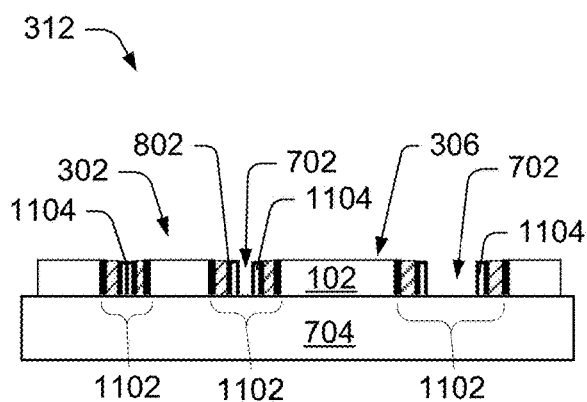
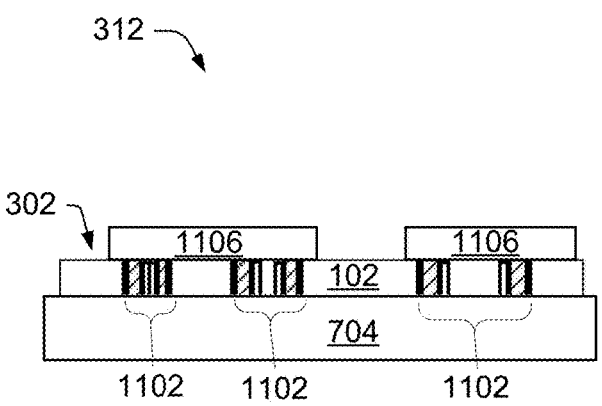
FIG. 11C  FIG. 11D

INTERCONNECT STRUCTURES

PRIORITY CLAIM AND CROSS-REFERENCE TO RELATED APPLICATION

This application claims the benefit under 35 U.S.C. § 119(e)(1) of U.S. Provisional Application No. 62/748,653, filed Oct. 22, 2018, and of U.S. Provisional Application No. 62/902,207, filed Sep. 18, 2019, which are both hereby incorporated by reference in their entirety.

FIELD

The following description relates to integrated circuits ("ICs"). More particularly, the following description relates to manufacturing IC dies and wafers.

BACKGROUND

Microelectronic elements often comprise a thin slab of a semiconductor material, such as silicon or gallium arsenide, commonly called a semiconductor wafer. A wafer can be formed to include multiple integrated chips or dies on a surface of the wafer and/or partly embedded within the wafer. Dies that are separated from a wafer are commonly provided as individual, prepackaged units. In some package designs, the die is mounted to a substrate or a chip carrier, which is in turn mounted on a circuit panel, such as a printed circuit board (PCB). For example, many dies are provided in packages suitable for surface mounting.

Packaged semiconductor dies can also be provided in "stacked" arrangements, wherein one package is provided, for example, on a circuit board or other carrier, and another package is mounted on top of the first package. These arrangements can allow a number of different dies or devices to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package).

Additionally, dies or wafers may be stacked in a three-dimensional arrangement as part of various microelectronic packaging schemes. This can include stacking a layer of one or more dies, devices, and/or wafers on a larger base die, device, wafer, substrate, or the like, stacking multiple dies or wafers in a vertical or horizontal arrangement, and various combinations of both.

Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company. The bonding includes a spontaneous process that takes place at ambient conditions when two prepared surfaces are brought together (see for example, U.S. Pat. Nos. 6,864,585 and 7,485,968, which are incorporated herein in their entirety).

When bonding stacked dies using a direct bonding technique, it is usually desirable that the surfaces of the dies to be bonded be extremely flat and smooth. For instance, in general, the surfaces should have a very low variance in surface topography (i.e., nanometer scale variance), so that the surfaces can be closely mated to form a lasting bond. One or more bonding surfaces of the dies or wafers is usually planarized, using chemical-mechanical polishing (CMP), or the like, to achieve the extremely flat and smooth surface(s) desired for bonding.

Respective mating surfaces of the dies or wafers to be bonded (which may comprise silicon, or another suitable material) often include conductive interconnect structures (which may be metal) embedded within an inorganic dielectric layer (e.g., such as an oxide, nitride, oxynitride, oxycarbide, carbides, nitrocarbides, diamond, diamond like materials, glasses, ceramics, glass-ceramics, and the like) at the bonding surface.

The conductive interconnect structures may be formed by damascene techniques (for example), and may include structures having varying widths and sizes. The conductive interconnect structures can be arranged and aligned at the bonding surface so that conductive interconnect structures from the respective die surfaces are joined during the bonding. The joined interconnect structures form continuous conductive interconnects (for signals, power, heat transmission, mechanical stability, etc.) between the stacked dies or wafers.

The exposed surfaces of embedded conductive interconnect structures may also be planarized, separately or together with the bonding surfaces of the dies or wafers. The profile and/or topography of the exposed surfaces of the conductive interconnect structures can be important to forming reliable continuous conductive interconnects between the dies or wafers, as well as important to forming reliable dielectric-to-dielectric bonds between the dies or wafers.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

FIGS. 1A-1D show cross-sections of an example substrate having embedded conductive interconnect structures.

FIGS. 7A-7D show cross-sections of an example substrate having embedded conductive interconnect structures, including an example technique for forming openings in the conductive interconnect structures, according to an embodiment.

FIGS. 11A-11D show cross-sections of example substrates having embedded conductive interconnect structures with openings, including another example technique for forming the openings, and bonding solutions using the substrates, according to various embodiments.

DETAILED DESCRIPTION

Overview

Figure 2:
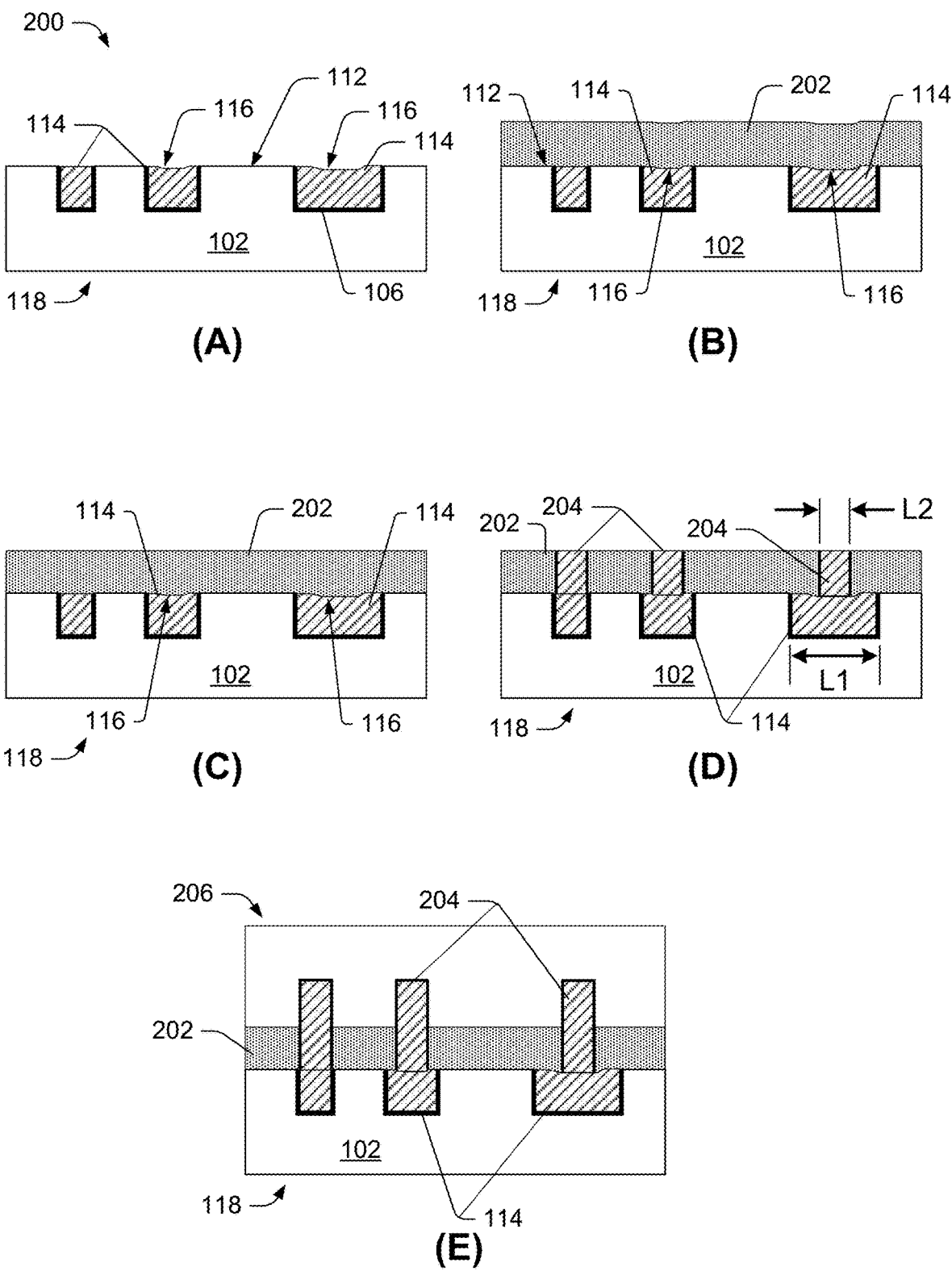
FIG. 2 shows a prior art solution to dishing of conductive interconnect structures.

Representative techniques and devices, including process steps may be employed to mitigate undesired dishing in conductive interconnect structures and erosion of dielectric bonding surfaces. For example, an embedded layer may be added to the dished or eroded surface to eliminate unwanted dishing or voids and to form a planar bonding surface. Additional techniques and devices, including process steps may be employed to form desired openings in conductive interconnect structures, where the openings can have a predetermined or desired volume relative to the volume of conductive material of the interconnect structures. Each of these techniques, devices, and processes can provide for the use of larger diameter, larger volume, or mixed-sized conductive interconnect structures at the bonding surface of bonded dies and wafers.

In some embodiments, one or more protective layers may also be deposited within unintentional or intentionally recessed portions of conductive interconnect structures to prevent or eliminate atom migration (e.g., to suppress surface mobility) within the recessed portions. Protective layers may include conductive or nonconductive materials in various embodiments.

Various implementations and arrangements are discussed with reference to electrical and electronics components and varied carriers. While specific components (i.e., dies, wafers, integrated circuit (IC) chip dies, substrates, etc.) are mentioned, this is not intended to be limiting, and is for ease of discussion and illustrative convenience. The techniques and devices discussed with reference to a wafer, die, substrate, or the like, are applicable to any type or number of electrical components, circuits (e.g., integrated circuits (IC), mixed circuits, ASICS, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic component." For simplicity, unless otherwise specified, components being bonded to another component will be referred to herein as a "die."

Referring to FIGS. 1A and 1B, in some examples a damascene technique, or the like, may be used to form embedded conductive structures in the insulating layer 102 of a die or wafer. A barrier layer 106 may be deposited over one or more cavities 104 within the insulating layer 102, followed by a seed layer 108. The cavities 104 may be of different sizes (i.e., volumes and widths), having different areas and located with various spacing relative to each other, as desired and/or by design.

As shown at FIG. 1B, the cavities 104 can be filled using an electroplating bath or other technique with a conductive material 110 such as copper, for example. The conductive material 110 may comprise the same material as the seed layer 108, or a different material in some cases. Extra conductive material 110 plating is removed from the bonding surface 112 as shown in FIG. 1C. Conductive material 110 remaining within the damascene cavities 104 forms conductive interconnect structures 114.

Referring to FIG. 1C, preparing a bonding surface 112 of a die or wafer for direct bonding can include planarizing the exposed surfaces of embedded conductive interconnect structures 114 along with the insulating (e.g., dielectric, etc.) layer 102 of the die or wafer. This can provide the desired profile and topography of the exposed surfaces of the conductive interconnect structures 114 and the top insulating layer 102. As a result of a discontinuity in the properties (difference in mechanical properties, polishing rates, etc.) of the conductive material 110 (e.g., metal, for example copper) of the interconnect structures 114 and the insulator material 102 (e.g., silicon dioxide, etc.) of the die or wafer surface, and their respective interactions with the polishing pad, polishing slurry, and other process parameters, the planarizing can produce dielectric erosion (see, for example erosion 404 at FIG. 4A) in high metal pattern density areas and dishing 116 in the exposed surface of the interconnect structures 114.

In general, the higher the metal pattern density, the greater the erosion. Similarly, the larger the area of the exposed surface of the conductive interconnects 114, the deeper the dishing defect 116. Both result in a notable variance in the overall surface topography of the die or wafer. The variance may be enough to weaken a direct bond or reduce the reliability of the bond at the locations of the surface variance (including reducing the reliability of metal to metal bonds).

While some recessing may be desirable, as discussed further below, a consequence of undesirable dishing on the exposed surface of conductive interconnect structures 114 can include the need for higher than desirable temperatures to bond the prepared devices 118. This can limit the types of devices that can be bonded or limit the size of the interconnects 114 used. Further, some interconnect structures 114 with large surface areas can experience dishing 116 that may be too deep to form a reliable diffusion bond. For instance, the metal of the structure 114 may not expand enough at annealing temperatures to form the bond. If a bond is formed, it may be defective and unreliable.

For example, in some cases as shown at FIG. 1D, the excessive dishing 116 of structures 114 with larger surface areas can result in a void 120 within the bonded structures 114, including after annealing or post bonding higher temperature thermal treatment step. The voids 120 can contribute to reliability concerns, since they can allow the migration of voids or vacancy dislocation defects emitted from the voids 120 due to surface mobility in metals atoms (such as copper, for example) causing device failures, as well as limiting the current carrying capacity of the interconnect structures 114.

An example of an attempt at mitigating the effects of excessive dishing 116 is shown by the process 200 at FIG. 2. For instance, a device 118 having conductive interconnect structures 114 with excessive dishing 116 is shown at block A. At block B, the process includes adding an insulating layer 202, such as a dielectric layer for example, over the uneven bonding surface 112, and then resurfacing the added bonding layer 202 (via CMP planarization or the like) at block C.

As shown at block D, interconnect structures 204 with smaller widths (L2) and smaller exposed surface areas than the larger widths (L1) and larger surface areas of the interconnect structures 114 can be formed (using single or dual damascene processes, for instance) in the added layer 202. The new interconnect structures 204 extend through the added bonding layer 202 and make electrical contact with the dished conductive structures 114 below. The goal is to reduce the exposed metal area on the new bonding layer 202 to reduce surface variance for a more reliable direct bond with stacked substrates 206 (see block E). However, the process of adding an additional bonding layer 202 can add 10 or more manufacturing steps, greatly increasing the cost of the devices 118 produced. Further, the new interconnect structures 204 (for example with a width L2) tend to be much smaller in area than the original structures 114 (for example with a width L1) below, often negatively affecting electrical connection properties and limiting wiring design freedom.

Example Implementations

In various implementations, innovative techniques and devices are used to mitigate the effects of dishing and recesses 116 in the surface of interconnect structures 114 of various sizes (including large area structures, for instance having a width or diameter of 10 microns or more), to form reliable low temperature metallic bonds. The techniques and devices are effective to prepare a direct bonding surface 112 on dies and wafers having embedded conductive interconnect structures 114 with varying widths (e.g., diameters), dimensions, and sizes, including mixed sizes on a single die surface 112, for instance structures having a width or diameter of 1 micron to over 1000 microns. Further, the techniques and devices allow the use of a standard manufacturing technique for surface 112 preparation on such varied dies and wafers. In the implementations, an embedded layer 304 (see FIG. 3D) is added to the dished surface of the interconnect structures 114 to reduce or eliminate recessing and/or voids. In an embodiment, the embedded layer 304 may be comprised of a dielectric material, such as SiC, SiC/SiO$_2$, SiN/SiO$_2$, or the like. For example, the embedded layer 304 may be comprised of the same or a different dielectric as the die or wafer surface 102. In other embodiments, the embedded layer 304 may be comprised of a conductive material, such as tungsten, an alloy of tungsten, a nickel alloy, or the like. Alternatively, the embedded layer 304 may include a low CTE material, a silicon containing material, such as doped or undoped polysilicon (which may form a silicide), or other suitable material. Still further, multiple coats or layers of insulating and/or conductive materials may be used.

Figure 3A:
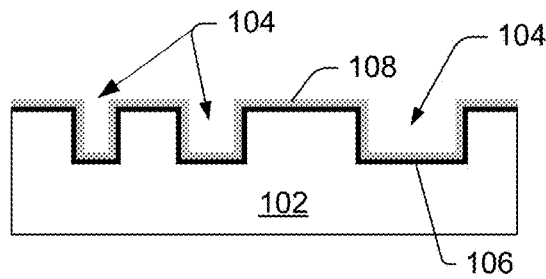
FIGS. 3A-3G show cross-sections of an example substrate having embedded conductive interconnect structures, including an example technique for mitigating undesired dishing of the conductive interconnect structures, according to an embodiment.
Figure 3B:
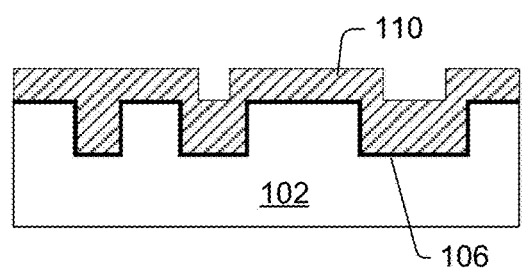

Referring to FIGS. 3A and 3B (showing cross-sectional profile views), patterned metal and oxide layers are frequently provided on a die, wafer, or other microelectronic substrate (hereinafter "die 302") as a hybrid bonding, or DBI®, surface layer. A representative device die 302 may be formed using various techniques, to include a base substrate (see FIG. 6) and one or more insulating or dielectric layers 102. The base substrate may be comprised of silicon, germanium, glass, quartz, a dielectric surface, direct or indirect gap semiconductor materials or layers or another suitable material. The insulating layers 102 are deposited or formed over the base, and may be comprised of inorganic dielectric material layers such as an oxide, nitride, oxynitride, oxycarbide, carbides, carbonitrides, diamond, diamond like materials, glasses, ceramics, glass-ceramics, and the like.

As discussed above, in some examples a damascene technique, or the like, may be used to form embedded conductive structures 114 in the insulating layer 102 of the die or wafer. A barrier layer 106 may be deposited over one or more cavities 104 within the insulating layer 102, followed by a seed layer 108, prior to depositing the material of the conductive interconnect structures 114, such that the barrier layer 106 is disposed between the conductive interconnect structures 114 and the insulating layer 102. The cavities 104 may be of different sizes (i.e., volumes and widths), having different areas and located with various spacing relative to each other, as desired and/or by design. A barrier layer 106 may be comprised of tantalum or titanium or cobalt containing materials, for example, or other conductive materials, to prevent or reduce diffusion of the material of the conductive interconnect structures 114 into the insulating layer 102.

Figure 3C:
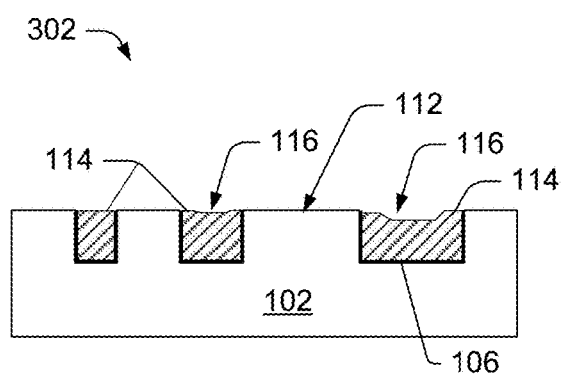

As shown at FIG. 3B, the cavities 104 can be filled using an electroplating bath or other technique with a conductive material 110 such as copper or a copper alloy, for example. The conductive material 110 may comprise the same material as the seed layer 108, or a different material in some cases. Extra conductive material 110 plating is removed from the bonding surface 112 as shown in FIG. 3C. Conductive material 110 remaining within the damascene cavities 104 forms conductive interconnect structures 114.

Forming a bonding surface 112 includes finishing the surface 112 of the insulating layer 102 to meet dielectric roughness specifications and any metallic layers (e.g., copper traces, structures, pads, etc.) to meet recess specifications, to prepare the surface 112 for direct bonding. In other words, the bonding surface 112 is formed to be as flat and smooth as possible, with very minimal surface topography variance.

Referring to FIG. 3C, preparing the bonding surface 112 of the die 302 or wafer for direct bonding can include planarizing the exposed surfaces of embedded conductive interconnect structures 114 along with the insulating (e.g., dielectric, etc.) layer 102 of the die 302 or wafer. This can provide the desired profile and topography of the exposed surfaces of the conductive interconnect structures 114 and the top insulating layer 102. Various conventional processes, such as chemical mechanical polishing (CMP) may be used to achieve the low surface roughness. This process provides the flat, smooth surface 112 that can result in a reliable bond.

However, as discussed above, a result of a discontinuity in the properties (difference in mechanical properties, polishing rates, etc.) of the conductive material 110 (e.g., metal, for example copper, aluminum, etc.) of the interconnect structures 114 and the insulator material 102 (e.g., silicon dioxide, etc.) of the die or wafer surface, and their respective interactions with the polishing pad, polishing slurry, and other process parameters, the planarizing can produce dielectric erosion 402 (see FIG. 4A) in the dielectric portions adjacent to the interconnect structures 114 and dishing 116 in the exposed surface of the larger interconnect structures 114.

Figure 3D:
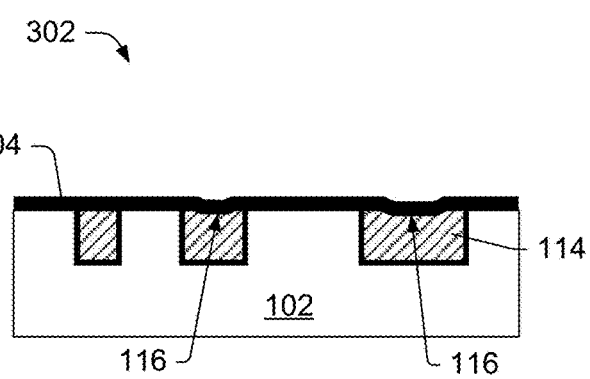
Figures 3E, 3F:
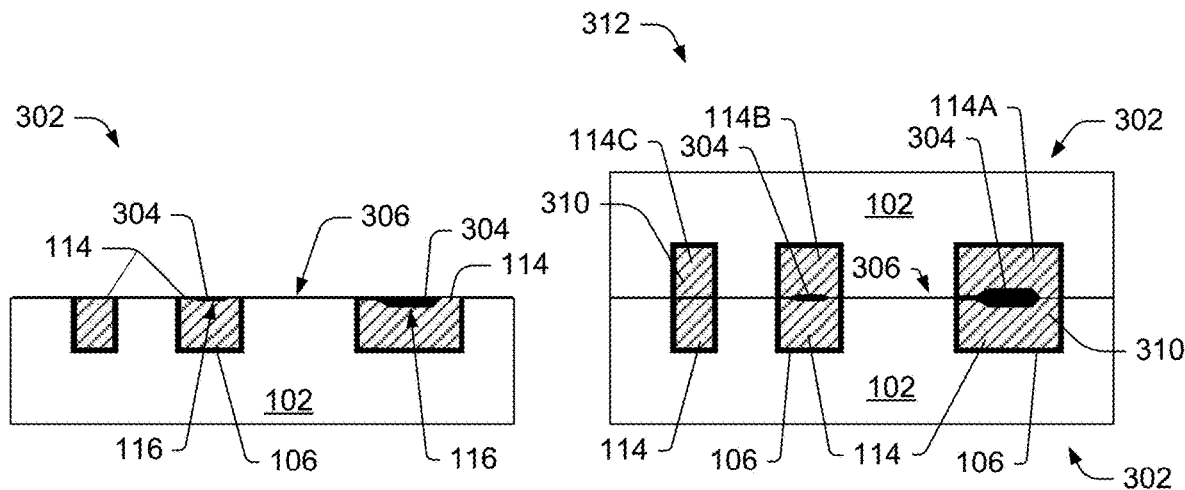

In various implementations, as shown at FIG. 3D, the embedded layer 304 is formed (e.g., deposited, coated, etc.) over the previously prepared surface 112 of the die 302, including the surfaces of the embedded structures 114 having recesses 116. The embedded layer 304 is planarized with a hard CMP pad. As shown at FIG. 3E, the embedded layer 304 may be planarized to the point of revealing the highest surfaces of the embedded interconnect structures 114, which now include the embedded layer 304 within a perimeter of the exposed portion of the structures 114, partially or fully filling the undesirable recesses 116 and covering a surface of the recesses 116. The prepared bonding surface 306, which includes the conductive interconnect structures 114 and the embedded layer 304 as well as the planarized insulating layer 102, now has minimal surface topography variance, and can be reliably bonded to the bonding surface of another die 302, wafer, etc. using direct bonding techniques.

Figure 3G:
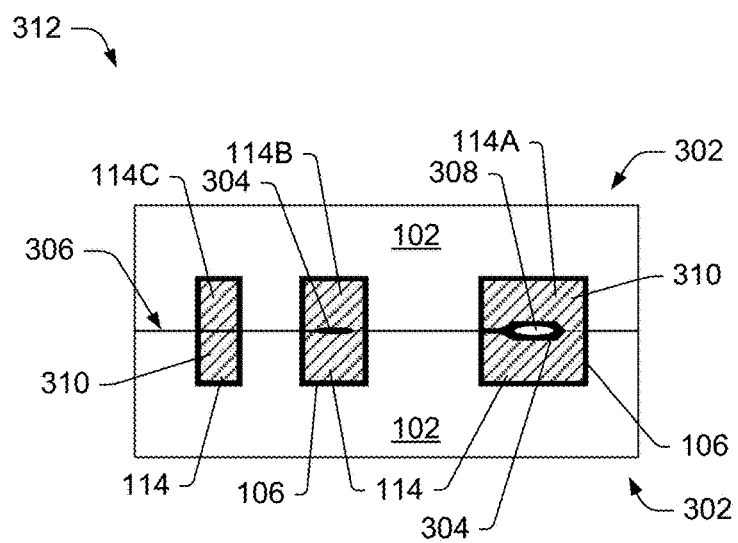

For instance, as shown at FIGS. 3F and 3G, a like die 302 (or wafer, etc.) that may have a similarly prepared bonding surface can be bonded to the bonding surface 306 to form a bonded device 312. In an embodiment, the joined conductive interconnect structures 114 can be diffusion bonded at lower temperatures, forming a unified conductive structure 310, and can include the embedded layer 304 within the unified conductive structure 310. This makes possible the use of conductive interconnect structures 114A with larger width or surface area, mixed-size conductive interconnect structures 114, and denser spacing of conductive interconnect structures 114B and 114C on the bonding surface 306.

In some cases, as shown at FIG. 3G, where the embedded layer 304 comprises an insulating material, the embedded layer 304 fills the void 120 that would be present otherwise, effectively suppressing the surface mobility of the atoms of the metal layer at the joint region or interface between the embedded layer 304 and the conductive interconnect structure 114. The embedded layer 304 is located within the perimeter, thus allowing the outer perimeter of the bonded conductive structures 114 to diffusion bond and to function electrically. In some instances, the outer perimeter is maintained to have a predetermined thickness (or width) for desired conductivity. Further, the material of the embedded layer 304 may be chosen for high bonding capability (e.g., SiC, SiC/SiO$_2$, SiN/SiO$_2$, or the like).

In other cases, where the embedded layer 304 comprises a conductive material, the embedded layer 304 has the previously discussed qualities (e.g., suppressing surface mobility within the recess, forming a desirable bonding surface with low surface topography variance, etc.), and also assists in conducting the signal, power, etc. at the unified conductive structure 310. The conductive material (e.g., tungsten, an alloy of tungsten, a nickel alloy, or the like) of the embedded layer 304 may be selected to have predetermined low surface mobility tendencies, reducing or avoiding atom migration. In some cases it may be preferable for the melting point of the embedded layer 304 to be higher than that of the material 110 of the conductive interconnect structure 114. In some cases, the embedded layer 304 may be comprised of multiple metals or like materials.

The embedded layer 304 disclosed herein is distinguished from the sealing layer, as described in U.S. Pat. No. 8,809, 123 to Liu et al., which has properties such that when the sealing layer (such as germanium, tin, or the like) is combined with the material of the conductive pads (e.g., copper) and heated to a predetermined temperature, a metal in a eutectic phase is formed. In contrast, the embedded layer 304 of the instant disclosure lines or coats the portion (e.g., the recess 116) of the exposed surface of the conductive interconnect structure 114, reducing the gap of the recess 116 to form a more flat bonding surface and covering the exposed metal of the interconnect structure 114 to suppress atom migration at the recess 116.

Referring to FIG. 3G, in an alternate embodiment, where the area of an interconnect 114 surface is particularly large, for instance having a width or diameter of 100 microns or more for example, the embedded layer 304 may also experience some dishing during planarization. In the embodiment, the dishing may result in a void 308 (or air gap) in the embedded layer 304 within the unified conductive structure 310. However, the void 308 in the embedded layer 304 may be inconsequential, since the embedded layer 304 still covers the metal of the interconnect structures 114, reducing surface mobility of the material 110 of the conductive interconnect structures 114. In one embodiment, a width of the occluded void 308 or cavity within the embedded layer 304 is less than 50% of a width of the interconnect structure 114.

In various implementations, the thickness of the embedded layer 304 is greater than a thickness of the barrier layer 106 deposited during the damascene process. For instance, the embedded layer 304 may have a thickness of about 15 to 30 nanometers over the surface of the recess 116. In other implementations, the embedded layer 304 may be thicker than 30 nanometers for some recesses 116. For instance, the depth of the recess 116 may be about 1 to 5 microns, in some examples. In some implementations, the thickness of the embedded layer 304 is less than a width (or diameter) of the recess 116.

In various embodiments, a width (or diameter) of the surface area of the embedded layer 304 is less than a width (or diameter) of the otherwise exposed surface of the conductive interconnect structure 114. For instance, a width or diameter of the embedded layer 304 may be less than 50%, 20%, 10%, 5%, or 2% of a width or diameter of the surface of the conductive interconnect structure 114, in various examples.

In some embodiments, the spacing of the interconnect structures 114 may be reduced for greater wiring design freedom. For example, previous ratios of pad pitch to pad width (or diameter) have been kept larger, on the order of 2:1 and 3:1 for some larger pads, due to increased interconnect 114 dishing and dielectric 102 erosion with closer ratios. In the embodiments, the pitch of the interconnect 114 pads may be reduced to less than 2. In this embodiment, a distance between two adjacent interconnect pads 114 is less than a width of the interconnect 114 pad when using the disclosed techniques and devices. For one example, a set of adjacent 20 micron interconnect 114 pads may now have a pitch of about 25 microns when applying the disclosed techniques and devices.

Figures 4A, 4B:
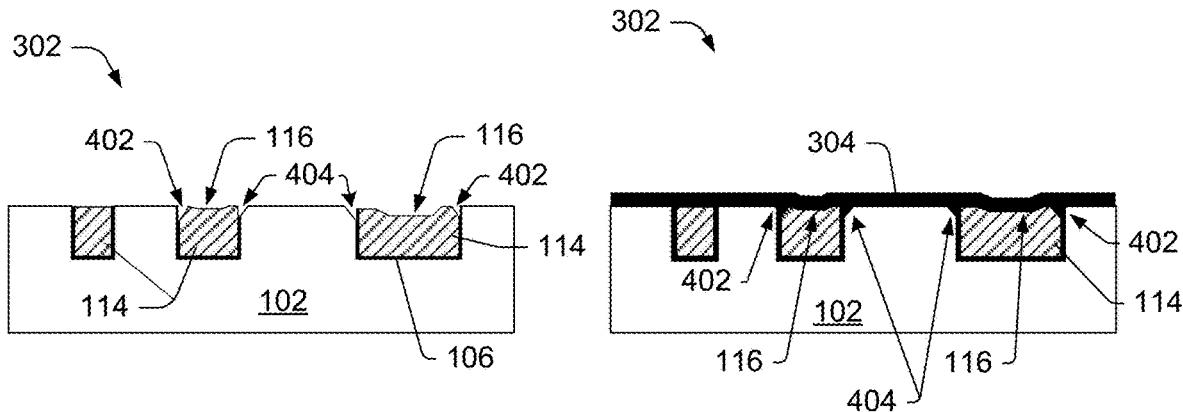
FIGS. 4A-4C show cross-sections of an example substrate having embedded conductive interconnect structures, including an example technique for mitigating undesired dishing of the conductive interconnect structures and erosion of the substrate, according to an embodiment.
Figure 4C:
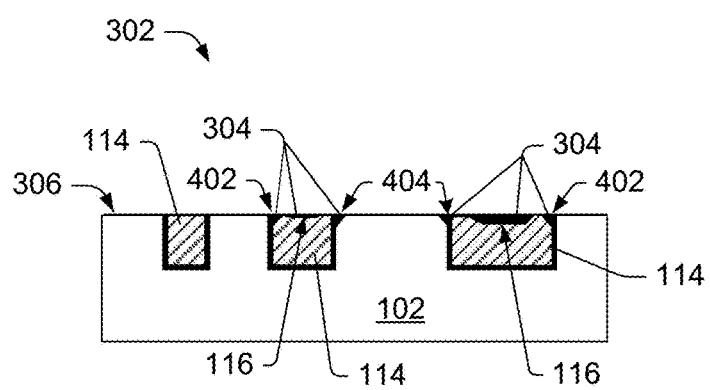

Referring to FIGS. 4A-4C, in another implementation, the embedded layer 304 may also be used outside of the recess 116 of the conductive structure 114, including inside or outside the barrier layer 106 of the conductive structure 114.

In one example, as shown at FIG. 4A, the conductive structure 114 may have one or more cavities 402 of missing metal at the perimeter of the structure 114. For instance, processing steps may cause some of the conductive structure 114 to corrode off, or the like, leaving the cavities 402 behind.

In an embodiment, as shown at FIG. 4B, the deposited embedded layer 304 can fill the cavities 402 where the metal of the structure 114 is missing. As shown at FIG. 4C, the embedded layer 304 filling the cavities 402 can smooth out the surface of the bonding layer 306 when the embedded layer 304 is planarized. In some embodiments, polishing the embedded layer 304 traps the material of the embedded layer 304 in the cavities 402 between the barrier layer 106 and the conductive structure 114.

In another example (as also shown at FIGS. 4A-4C), the dielectric material 102 at the surface adjacent to the conductive structure 114 may be eroded (or "rounded," see 404) at the outer edges of the conductive structure 114 or at the barrier layer 106 during the planarization step. The erosion 404 may be more pronounced at regions with high metal density, for instance. As shown at FIG. 4A, the dielectric erosion 404 can comprise one or more cavities or recesses in the dielectric 102 outside the edges of the conductive structure 114 or the barrier layer 106. As shown at FIG. 4B, the deposited embedded layer 304 can also fill the cavities 404 where the dielectric 102 is missing. As shown at FIG. 4C, the embedded layer 304 filling the cavities 404 can smooth out the surface 306 of the bonding layer 102 when the embedded layer 304 is planarized. In some embodiments, polishing the embedded layer 304 traps the material of the embedded layer 304 in the cavities 404 or recesses. While the cavities 402 and 404 may be inadvertently formed as part of the process, such cavities or recesses may be provided intentionally at these locations or elsewhere on the bonding surface and may have any suitable shape, profile, or configuration as desired or required.

Figures 5A, 5B:
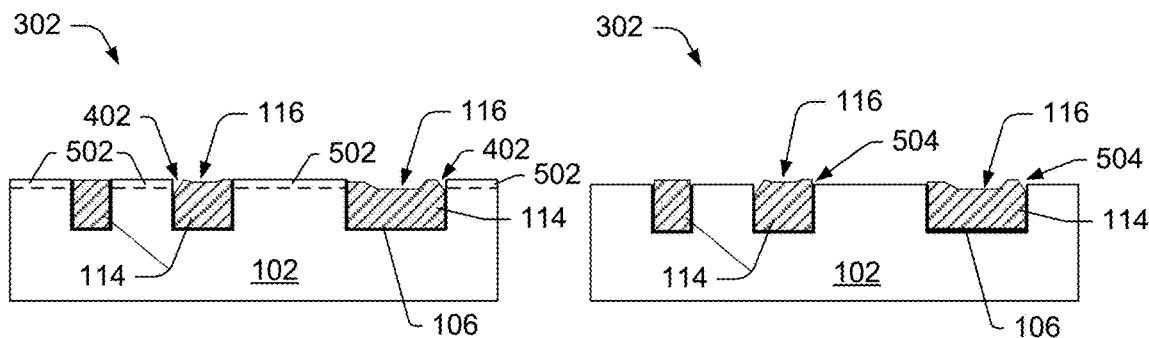
FIGS. 5A-5D show cross-sections of an example substrate having embedded conductive interconnect structures, including another example technique for mitigating undesired dishing of the conductive interconnect structures and erosion of the substrate, according to an embodiment.

In a further embodiment, referring to FIG. 5A, another technique may be employed to mitigate the effects of missing metal portions of the conductive interconnect structures 114, or the like, while remedying the dishing 116 of the structures 114. In the embodiment, selective portions 502 of the dielectric layer 102 may be removed such that portions of sidewalls 504 of the conductive interconnect structures 114 protrude above the surface of the dielectric layer 102 (FIG. 5B).

Figures 5C, 5D:
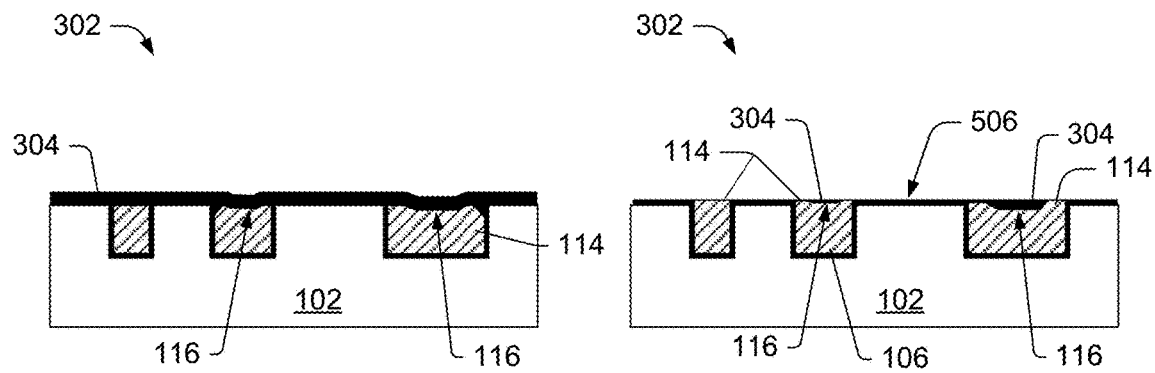

As shown at FIG. 5C, the embedded layer 304 may be deposited over the surface of the insulating layer 102, including the interconnect structures 114. The embedded layer 304 can build up the surface of the insulating layer 102, providing a new layer 506 to be prepared for bonding. The embedded layer 304 may now contact at least a portion of the metal sidewall 504 of the interconnect structures 114 and/or the barrier layer 106. As shown at FIG. 5D, the embedded layer 304 can be planarized to the point of revealing the highest points of the interconnect structures 114, while retaining a flat surface with minimal surface topography variance. The interconnect structures 114 may now include the embedded layer 304 within a perimeter of the exposed portion of the structures 114 (filling the recesses 116). Any other cavities (e.g., 402, 404) in the interconnect structures 114 and/or the insulating layer 102 are also covered by the embedded layer 304.

Figure 6:
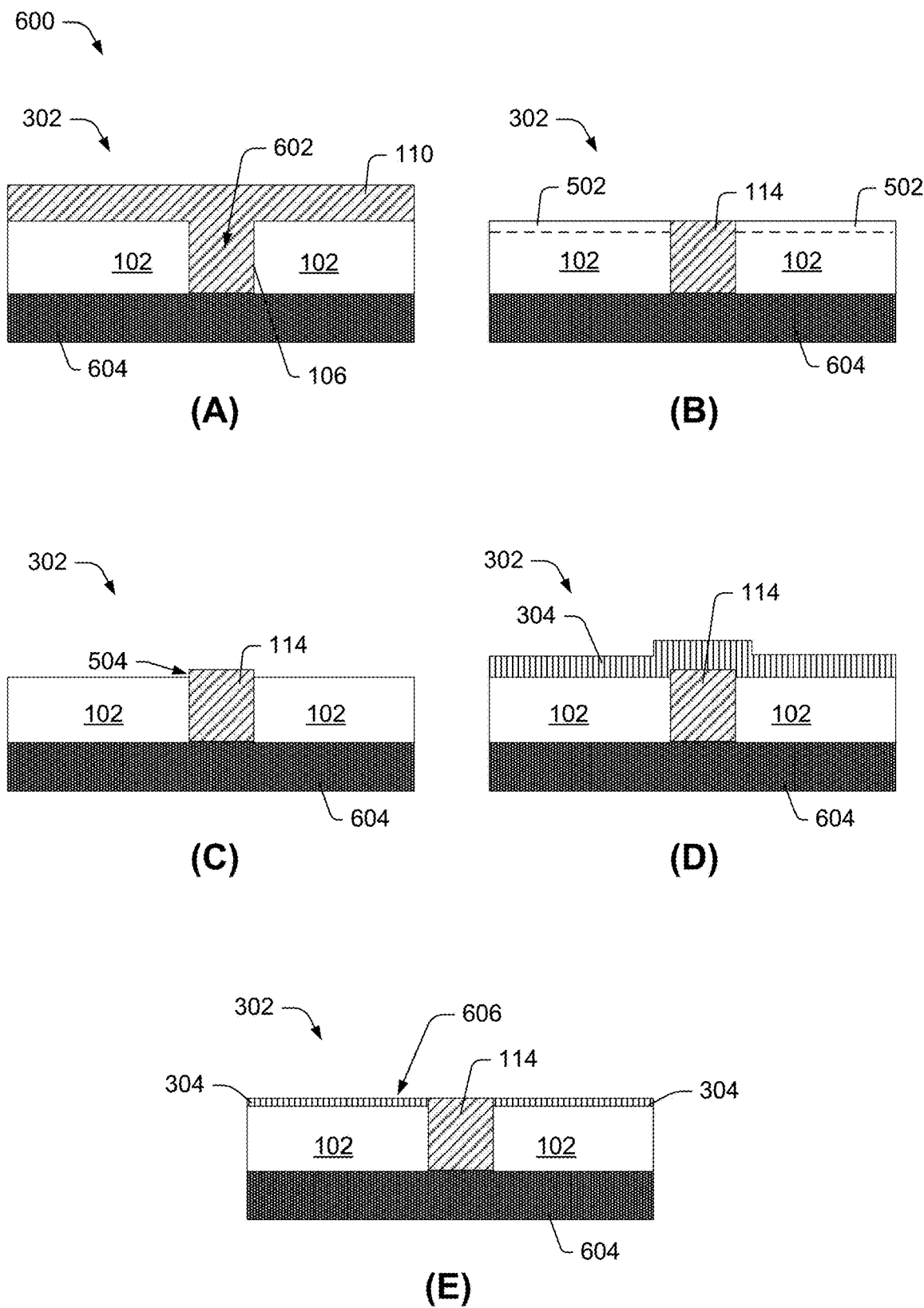
FIG. 6 shows an example top layer process technique for forming a bonding layer on a substrate with embedded conductive interconnect structures, according to an embodiment.

Referring to FIG. 6, in various implementations, the disclosed technique can also be performed (shown as process 600) to provide a passivation layer 606 over the insulating layer 102, as a functional layer, a protective layer, or a preferred bonding layer. Block A shows a cavity 602 in an insulating layer 102, over a base layer 604, that is filled with a conductive material 110 (e.g., copper, etc.) using a damascene technique, or the like (as discussed above). As shown at block B, the conductive material over-fill from the damascene process is removed, by planarization, etch, or the like, forming the conductive interconnect structure 114 in the cavity 602. In some cases, it may be advantageous to make the surface of the insulating layer 102 as flat and smooth (as if for direct bonding, for instance) as possible.

At block C, portions 502 of the dielectric 102 can be selectively removed as desired (e.g., about 30-100 nm), using a selective wet etch for example, leaving the conductive structure 114 protruding from the insulating layer 102. At block D, the embedded layer 304 is deposited over the surface of the insulating layer 102, including the interconnect structures 114. The embedded layer 304 may contact at least a portion of the metal sidewall 504 of the interconnect structures 114 and/or the barrier layer 106. The embedded layer 304 can be planarized (CMP, for example) to the point of revealing the highest point(s) of the interconnect structures 114, while retaining a flat surface with minimal surface topography variance, as discussed above and shown at block E. The passivation layer 606, which may comprise a preferred bonding layer, a protective layer, and/or a functional layer for the die 302 comprises the planarized embedded layer 304 remaining on the insulating layer 102.

Additional Embodiments

In general, when directly bonding dies or wafers having bonding surfaces containing a combination of a dielectric layer 102 and one or more metal features, such as the embedded conductive interconnect structures 114, the dielectric surfaces 102 bond first and the metal 110 of the features 114 expands afterwards, as the metal 110 is heated during annealing. The expansion of the metal 110 can cause the metal 110 from both dies 302 to join into a unified conductive structure 310 (metal-to-metal bond). While both the insulating layer 102 and the metal 110 are heated during annealing, the coefficient of thermal expansion (CTE) of the metal 110 relative to the CTE of the insulating layer 102 generally dictates that the metal 110 expands much more than the insulating layer 102 at a particular temperature (e.g., ~300 C). For instance, the CTE of copper is 16.7, while the CTE of fused silica is 0.55, and the CTE of silicon (e.g., base 604) is 2.56. In some cases, the greater expansion of the metal 110 relative to the insulating layer 102 can be problematic for direct bonding stacked dies 302.

Some embedded conductive interconnect structures 114 may extend partially into the insulating layer 102 below the prepared bonding surface 112. For instance, some patterned metal features may be about 0.5-3 microns thick. Other conductive interconnect structures 114 may comprise thicker (e.g., deeper) structures, including metal through silicon vias (TSVs) or the like, that may extend partly or fully through the insulating layer 102 and include a larger volume of metal 110. For instance, a TSV may extend about 100 microns or more, depending on the thickness of the substrate. In some applications, it may be desirable to form large diameter metal structures 114, for instance having a width or diameter of 10 microns to over 100 microns, which would also include a larger volume of metal 110. As mentioned above, the metal 110 of these structures 114 expands when heated. In some cases, the metal 110 expansion can cause undesirable localized stress, including potential delamination of the bonding surfaces at the location of the structures 114. In a worst-case, the stress of the expanded metal 110 may separate the bonded dielectric surfaces 112 of the stacked dies 302.

Also, it can be relatively expensive to form fully-filled large cavities 104 with metal or other conductive material 110. For example, filling TSV arrays having a diameter of 5 microns and a depth of 100 microns by electroplating methods may require 10 to 20 minutes of metal plating time. However, filling TSV arrays having a diameter of 20 microns and a similar depth may require plating times between 120 to 400 minutes or even longer. The longer plating times reduces the throughput of the plating tool for filling larger cavities 104. Similarly, it can cost more to planarize the larger metal filled cavities 104 to remove unwanted metal on the bonding surface. In practice, the larger the metal filled cavity 104 the greater the mismatch stress due to differences in the coefficient of thermal expansion (CTE) between the coated metal 110 and the insulating layer 102. In the case of large metal TSVs, the larger the diameter of the via, the larger the keep out zone for devices in the device portion of the substrate.

Referring to FIGS. 7A-7D, in various embodiments, devices, techniques, and processes may be employed to mitigate the effects of undesirable high-stress, including the potential for delamination due to metal 110 expansion, improve throughput, and reduce cost of ownership for forming planar metal in large cavities 104. This can allow for the use of larger diameter structures 114, larger volume structures 114, or mixed-sized structures 114. As an example, the diameter of 114A is larger than the diameter of 114B, which is in turn larger than that of 114C.

For example, in various embodiments, an opening 702 may be intentionally formed in a conductive interconnect structure 114. The opening 702 may extend a predetermined depth below the surface of the conductive interconnect 114. For a given metal coating time, the volume of opening of 702A can be larger than that of 702B and the volume of opening 702B can be larger than 702C. The volume of the opening 702 may be selected based on the material 110 of the conductive interconnect 114, its thickness or volume of material 110, and its anticipated expansion during annealing. In various embodiments the opening 702 may include any recessed portion, gap, cavity, hollow, or the like in the conductive interconnect structure 114 that provides room for the material 110 of the interconnect structure 114 to expand into. A suitably sized opening 702 can reduce or eliminate the stress of the expanding material 110 on the bond joint 306 of the stacked dies 302 or wafers, since the metal 110 can expand into the opening 702. The width of the opening 702 may range for example between less than 100 nm to over 20 microns. With an opening 702 of predetermined size, it can still allow the material 110 of respective interconnect structures 114 to reliably join and form continuous conductive interconnects 310 between the stacked dies 302 or wafers.

In various embodiments, the opening 702 may be intentionally formed to have a desired preselected volume (e.g., to accommodate excessive stresses resulting from the mismatch in the thermal expansion of the coated metal 110 in the cavity 104 and the surrounding insulator 102 materials). In other embodiments, the opening 702 may be allowed to form as part of processing the bonding surface 306 of the die 302 or wafer. In such cases, the volume of the opening 702 may be predictable based on the processes and materials involved.

For example, in some embodiments, the opening 702 may be formed intentionally while the conductive interconnect structure 114 is formed. For instance, as shown at FIGS. 7A-7C, conductive interconnect structures 114 may be formed using damascene techniques, and may include cavities 104 and structures 114 having mixed widths (104A, 104B, and 104C) and depths. As illustrated at FIG. 7A, one or more damascene cavities 104 may be formed in the surface of the dielectric layer 102 of the die 302 or wafer or substrate of interest, to extend partially or fully through the dielectric layer 102. In one example, a cavity 104 may have a width or diameter of at least 10 microns and a depth of at least 5 microns or even 10 microns. Alternately, the cavities 104 may be formed to extend into the base substrate (not shown—see base 604 at FIG. 6 for example) of the die 302 or wafer. A barrier layer 106 and a seed layer 108 are deposited over the exposed surfaces of the cavities 104.

As shown at FIG. 7B, the cavities 104 are partially filled with conductive material 110 (e.g., copper, a copper alloy, etc.) using a super-filling electroplating bath, or using a conformal electroplating or electroless plating bath or the like. In some embodiments, the conductive layer 110 may be coated into the cavity 104 by a physical vapor deposition method (PVD) or by an atomic layer deposition method, chemical vapor deposition method, or spin coating of the conductive layer 110 into the cavity 104. The partial filling of the conductive layer 110 in the cavities 104 results in conductive interconnect structures 114 with intentional openings 702 (e.g., 702A, 702B, and 702C) within the damascene cavities 104 (e.g., 104A, 104B, and 104C, respectively).

The bonding surface 306 of the die 302 or wafer or substrate of interest is planarized (using chemical-mechanical polishing (CMP), or the like) to prepare the dielectric surface 102 and conductive interconnect structures 114 for bonding. This includes removing the unwanted layer of plating 110 and other conducting barrier layer 106 from the damascene process from the dielectric bonding surface 306, as illustrated in FIG. 7C. The remaining openings 702' (e.g., 702A', 702B' and 702C') are confined to the interconnect structures 114, and may have predetermined volumes. In one embodiment, a width ("w") of the remaining opening 702' at the bonding surface 306 of the die 302 or wafer is greater than a thickness of the barrier layer 106 between the conductive layer 110 and the dielectric layer 102. Also, the width of the remaining opening 702A' is larger than the width of remaining opening 702B' and the width of remaining opening 702B' is larger than the width of remaining opening 702C'. In other applications, a width ("w") of the remaining opening 702' at the bonding surface 306 is larger than a thickness of the conductive layer 110 within the respective cavity 104. In some applications, the depth ("d") of the remaining opening 702' may be less than 50 nm, and preferably less than 100 microns.

The bonding surface 306 of the die 302 or wafer may be ready for bonding to another like die 302 or wafer, or to some other prepared substrate 704, to form a bonded device 312. In various embodiments, the substrate 704 may comprise the same or a dissimilar or a different material than the die 302. For instance, the substrate 704 may comprise a dielectric, a glass, a semiconductor, or other material. After the bonding operation, in which the planar portion or portions of the conductive interconnect structures 114 (114A, 114B and 114C) on the bonding surface 306 are directly bonded to the prepared surface of the opposing substrate 704, the remaining openings 702' are occluded within the conductive interconnect structures 114, as depicted in FIG. 7D.

Figure 8A:
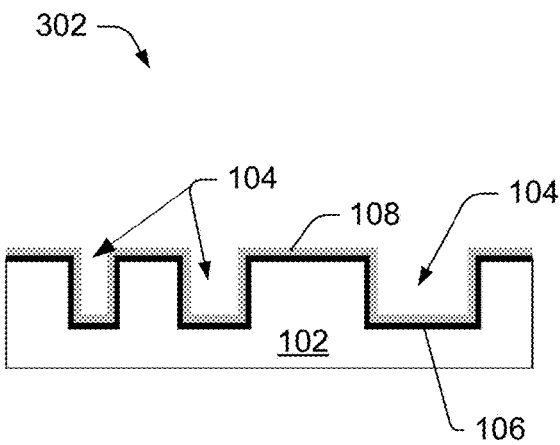
FIGS. 8A-8D show cross-sections of an example substrate having embedded conductive interconnect structures, including another example technique for forming openings in the conductive interconnect structures, according to an embodiment.
Figure 8B:
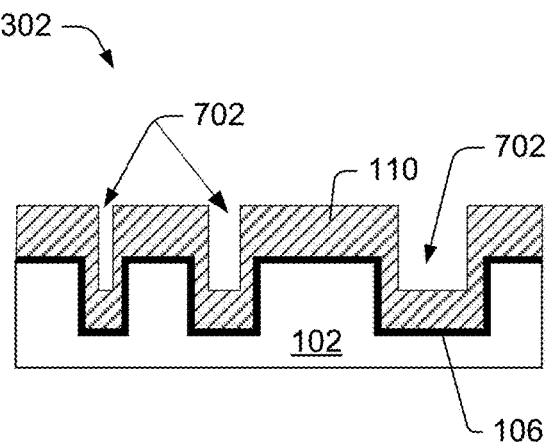
Figure 8C:
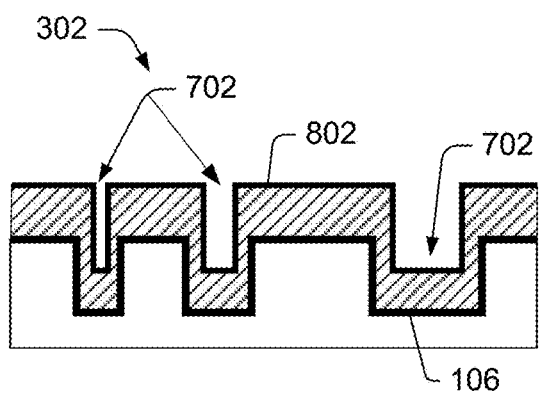
Figure 8D:
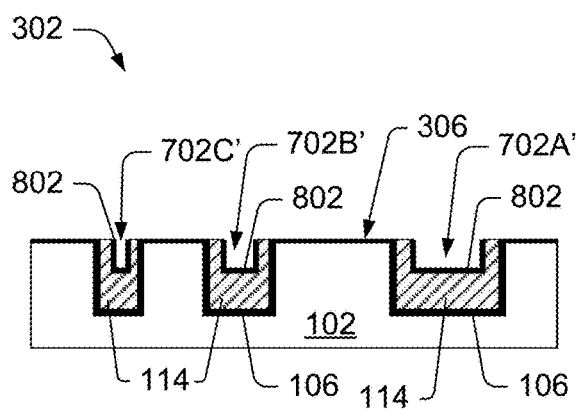

In an alternate process, as shown at FIGS. 8A-8D, after partially filling the damascene cavities 104 with the conductive material 110, a protective layer 802 may be formed (e.g., deposited, coated, etc.) over the surface of the conductive material 110, including within the opening 702 in the surface of the conductive interconnect structures 114 (see FIGS. 8C and 8D).

In various embodiments, the protective layer 802 may comprise a dielectric material, such as $SiO_2$, SiC, SiN, $SiC/SiO_2$, $SiN/SiO_2$, SiN/polysilicon, inorganic dielectric/organic dielectric or the like. For example, the protective layer 802 may be comprised of the same or a different dielectric as the insulating layer 102 of the die 302 or wafer surface. In other embodiments, the protective layer 802 may be comprised of a conductive material, such as tungsten, an alloy of tungsten, a nickel alloy, tantalum or titanium and the various alloys, for example TaN/Ta or Ta/TaN, Ti/TiN, cobalt, CoP, NiP, CoWP, CoP/NiP or the like. Still further, the protective layer 802 may include a low CTE material, a silicon containing material, such as doped or undoped polysilicon (which may form a silicide), or other suitable material. Still further, multiple coats or layers of insulating and/or conductive materials may be used.

The protective layer may be deposited by PVD methods or from electrolytic or by electroless plating baths or other techniques. Alternatively, the protective layer 802 may include multiple coats or layers of insulating and/or conductive materials. In some applications, the protective layer 802 may comprise a conformal coating of one or more materials. One of the benefits of the protective layer 802 is to suppress the surface mobility of metal atoms at the surface of the conductive layer 110, adjacent to the protective layer 802 within the opening 702, improving the reliability of the bonded interconnect 114. Thus the protective layer 802 can act as a bonding surface for a portion of the conductive interconnect 114.

In an embodiment, the thickness of the protective layer 802 is less than the thickness of the conductive layer 110 within the respective cavities 104 bounded with the protective layer 802 and the barrier layer 106. In other embodiments, the protective layer 802 may be thicker than the conductive layer 110. After planarization of the bonding surface 306, including removing unwanted materials from the bonding surface 306, the remaining openings 702' (702A', 702B' and 702C') in the surfaces of the interconnect structures 114 retain the protective layer 802 on the interior surfaces of the remaining openings 702', which can have predetermined volumes.

Figures 9A, 9B:
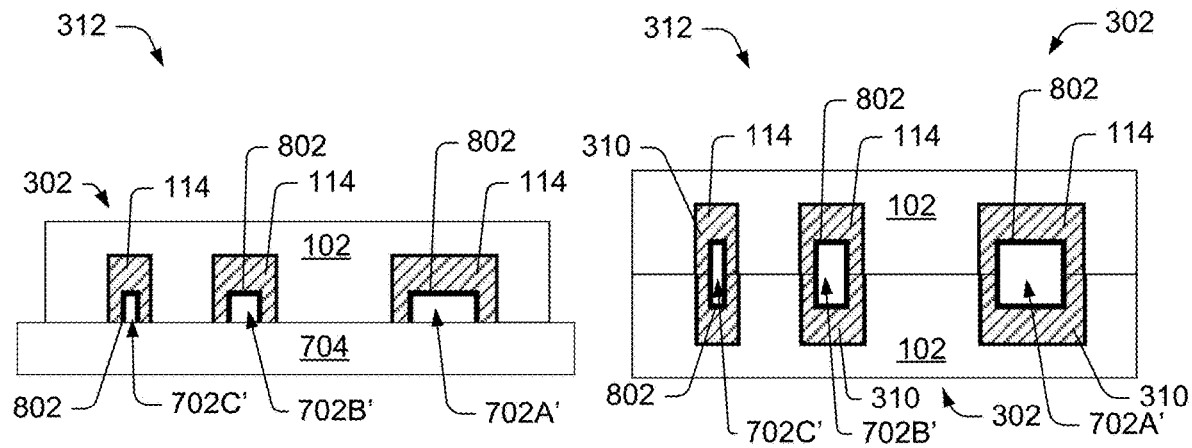
FIGS. 9A-9C show cross-sections of example substrates having embedded conductive interconnect structures with openings, including bonding solutions using the substrates, according to various embodiments.
Figure 9C:
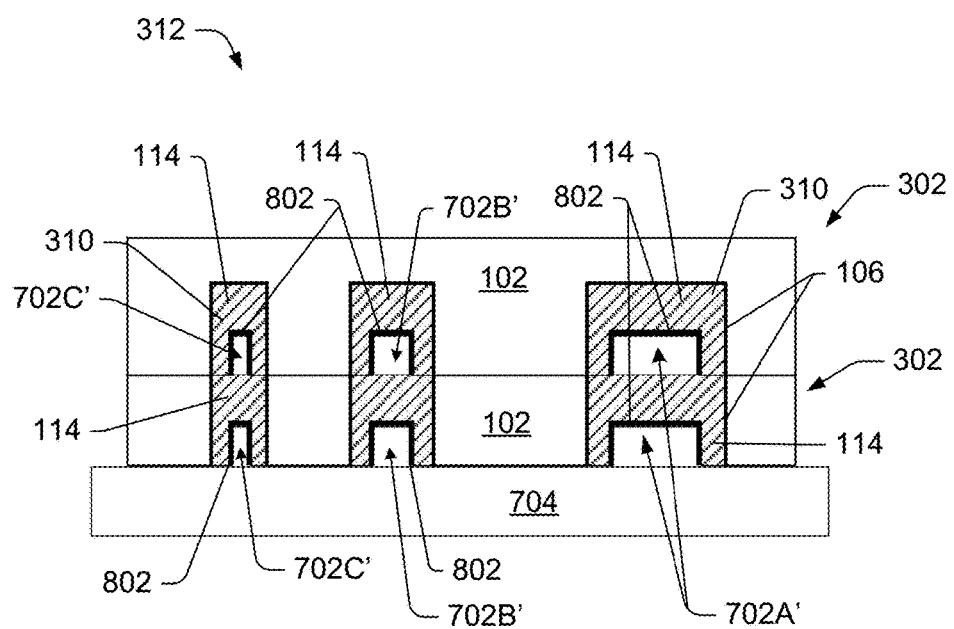

The die 302 or wafer may be prepared for bonding to another like die 302 or wafer (as shown at FIGS. 3F, 3G, 9B, and 9C), and/or to some other prepared substrate 704 (as shown at FIGS. 7D, 9A, and 9C) to form a bonded device 312. In one example, the planarized wafer of FIG. 8D may be singulated by known methods, the singulated wafer is cleaned and prepared for bonding operation. For instance, the die 302 from the singulated wafer or wafer may be bonded to a planar substrate 704 or other carrier to form the bonded device 312. In one embodiment, the planar carrier 704 or the die 302 may include a single or multilevel BEOL interconnect structure 114 or a dielectric comprising one or more RDL layers. During the bonding operation, the conductive interconnect structures 114 of the dies 302 are aligned to and mated intimately with the receiving conductive interconnect structures 114 on the surface of the like die 302 or wafer and/or the prepared substrate 704 to form the unified conductive structures 310.

In various cases, as shown at FIGS. 9A-9C, the dies 302 or wafers may be bonded front-to-front (FIG. 9B) or back-to-front (FIG. 9C) and/or bonded to a planar substrate 704 (FIGS. 9A and 9C) to form a bonded device 312. After bonding, the conductive interconnect structures 114 have enclosed cavities 702' with a protective layer 802 lining the interior surfaces of the cavities 702'. The profile of the occluded cavity 702' or cavities 702' viewed from a cross section of the die 302 may be geometrically regular or irregular shapes. In various embodiments, the receiving substrate 704 may be comprised of a conductive layer occluding one or more cavities 702', as shown at FIGS. 9A and 9C.

In other words, in an example embodiment, as shown at FIG. 7D, a bonded device 312 can comprise a portion of a conductive layer (e.g., part of a conductive interconnect 114 at the bonding surface of the die 302) directly bonded to a substrate 704 and another portion of the conductive layer (e.g., an interior portion of the occluded cavity 702' within the conductive interconnect 114) not bonded to the same substrate 704. And in another implementation, as shown at FIG. 9A, a bonded device 312 can comprise a portion of conductive layer (e.g., part of a conductive interconnect 114 at the bonding surface of the die 302) directly bonded to a substrate 704 and another portion of the conductive layer (e.g., an interior portion of the occluded cavity 702' within the conductive interconnect 114) directly coated with a protective layer 802 not bonded to the same substrate 704.

In some applications, with wafers or dies 302 comprising TSVs or through electrodes, after the bonding operation as shown in FIG. 9B, the backside of the bonded wafer of dies 302 may thinned and formed to expose the backside of the conductive structures (TSVs or through electrodes). Additional prepared dies 302 or wafers may be electrically coupled to the exposed TSV on the bonded die 302 or wafer backside. The electrically coupling of the said dies 302 or wafer may comprise the use DBI methods or flip chip methods, amongst others.

Further Embodiments

Further embodiments are shown at FIGS. 10A-12. In one embodiment, as shown at FIGS. 10A-10D, the partial-filling of conductive material 110 discussed above is applied thinner, and amounts to a conformal or non-conformal metal coating 1002 within the damascene cavity 104. This thinner coating 1002 can result in an opening 702' with a very large volume with respect to the conductive interconnect structure 114, depending on the thickness of the conductive layer 1002.

Figure 10A:
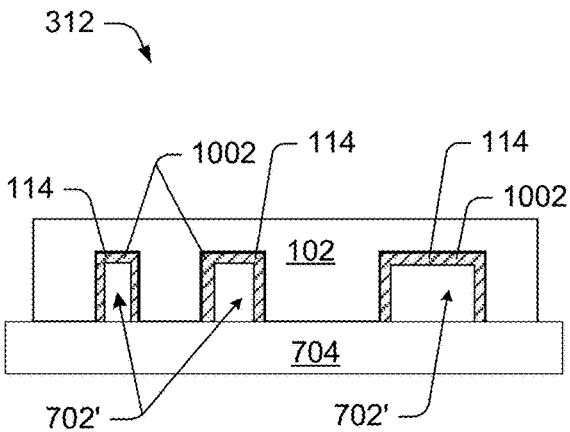
FIGS. 10A-10D show cross-sections of example substrates having embedded conductive interconnect structures with openings, including additional bonding solutions using the substrates, according to various embodiments.
Figure 10B:
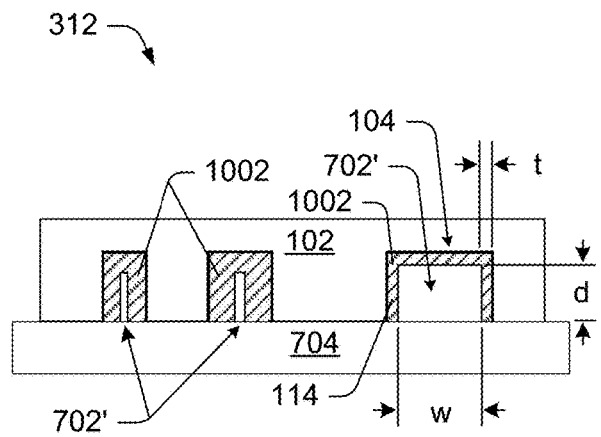

Additionally, as shown at FIG. 10B, the coating 1002 may be thicker in some cases, or have varying thicknesses for different devices 312 or within a single device 312. For instance, in some embodiments, the cross-sectional width ("w") of the opening 702' is more than 3 times larger than the thickness ("t") of the conductive layer 1002 (on the sidewall of the cavity 104, for example). Also, in some embodiments, a depth ("d") of the opening 702' can be greater than a cross-sectional width ("w") of the opening 702'.

Figure 10C:
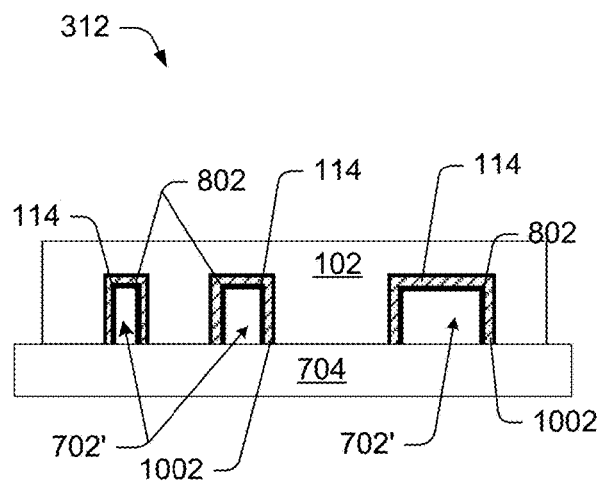
Figure 10D:
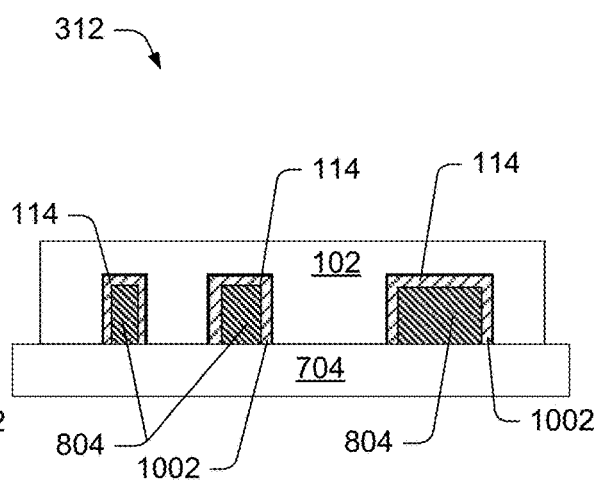

In an implementation, as shown at FIG. 10C, the interior surfaces of the opening 702' (i.e., the exposed surfaces of the conductive layer 1002) can be coated with the protective coating 802, as described above. In another embodiment, as shown at FIG. 10D, a compliant material 1004 (such as a fill or encapsulant material, for instance) may be deposited within the opening 702' of a conductive interconnect structure 114 (with or without a protective layer 802). The compliant material 1004 may partially or totally fill the opening 702.

Figure 12:
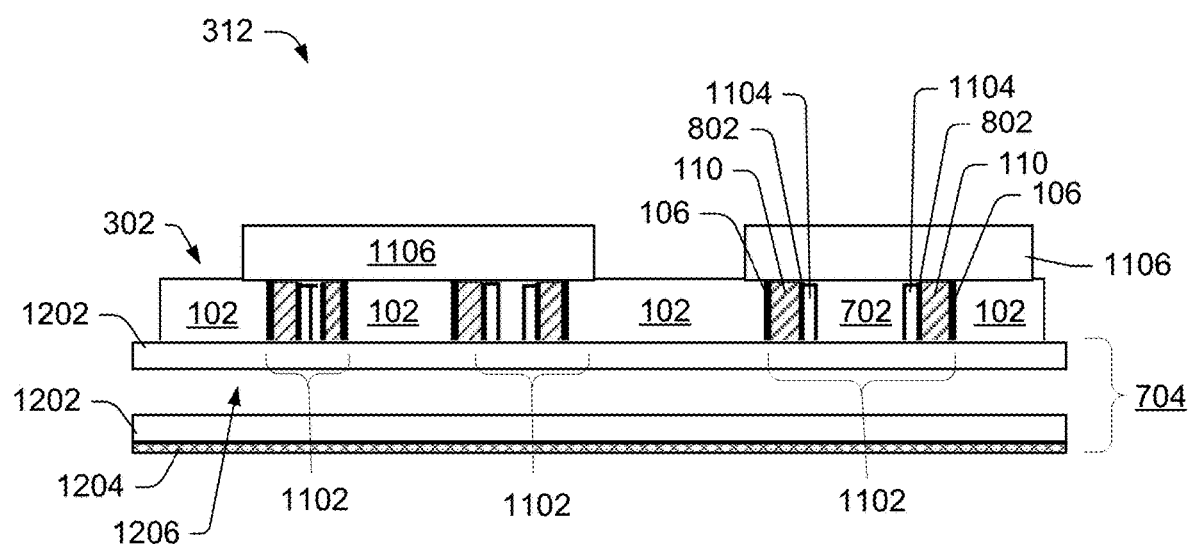
FIG. 12 shows a cross-section of a substrate having embedded conductive interconnect structures with openings, utilized as an optical device, according to an embodiment.

Referring to FIGS. 11A-12, in some embodiments, the described techniques and processes can be used to form through-silicon vias 1102 (TSVs), or the like for devices 312. In the case of a TSV 1102, multiple layers may line the interior side-walls of the opening 702 within the TSV 1102. In some embodiments, the TSV 1102 may be formed by a via middle or via last method. Regardless of how the TSV 1102 or thru-substrate via or thru-glass via (TGV) or thru-substrate electrode (TSE) or thru-panel via is formed, a backside reveal process may be applied to expose the partially conductive interconnect structure 114 from the backside, in the case of a via middle process.

For example, as shown at FIGS. 11A and 11B, after the partial filling of the cavities 104, one or more additional layers 1104 may be applied over the conductive layer 110, with or without the protective layer 802 (depending on the embodiment). In various examples, the one or more additional layers 1104 may include one or more dielectric layers, or the like.

As shown at FIG. 11B, planarizing the bonding surface 306 forms the conductive interconnects 114 having the one or more additional layers 1104. Referring to FIG. 11C, the backside of the die 302 may be thinned and the backside of the conductive interconnects 114 revealed by grinding, polishing, reactive ion etching methods, and other known methods to expose the interior of the conductive interconnect structures 114, which forms the TSVs 1102. The TSVs 1102 provide hollows or pass-through conductive openings 702 through the die 302, as shown at FIGS. 11C and 11D. In some embodiments, as shown, the interior conducting surface of the pass-through opening 702 is lined with a dielectric layer 1104. The prepared backside may then be direct bonded to another die 302, wafer, or prepared substrate 704.

As shown at FIG. 11D, one or more components 1106, such as optical devices or other microelectronic components may be bonded to the front side bonding surface 306 of the die 302. In some cases, the TSVs 1102 provide electrical or optical signal transmission from the one or more components 1106 to the other die 302, wafer, or prepared substrate 704 bonded to the back side of the die 302. For instance, as shown at FIG. 12, an optical device 312 is shown. In the example, the substrate 704 may comprise one or more layers of glass 1202, and include a reflector 1204 and optionally a cavity 1206 as desired for the application. In such an instance, the TSVs 1102 may transmit optical signals, and may also transmit electrical signals in some cases.

In various other embodiments, other techniques may be used to vary the surface of a conductive interconnect structure 114, to mitigate the effects of metal expansion. For instance, in some examples, the surface of a conductive interconnect structure 114 may be selectively etched (via acid etching, plasma oxidation, etc.) to provide a desired opening 702 depth. In a further embodiment, a conductive interconnect structure 114 may be selected, formed, or processed to have an uneven top surface. For example, the top surface of the conductive interconnect structure may be rounded, domed, convex, concave, irregular, or otherwise non-flat.

Example Processes

Figure 13:
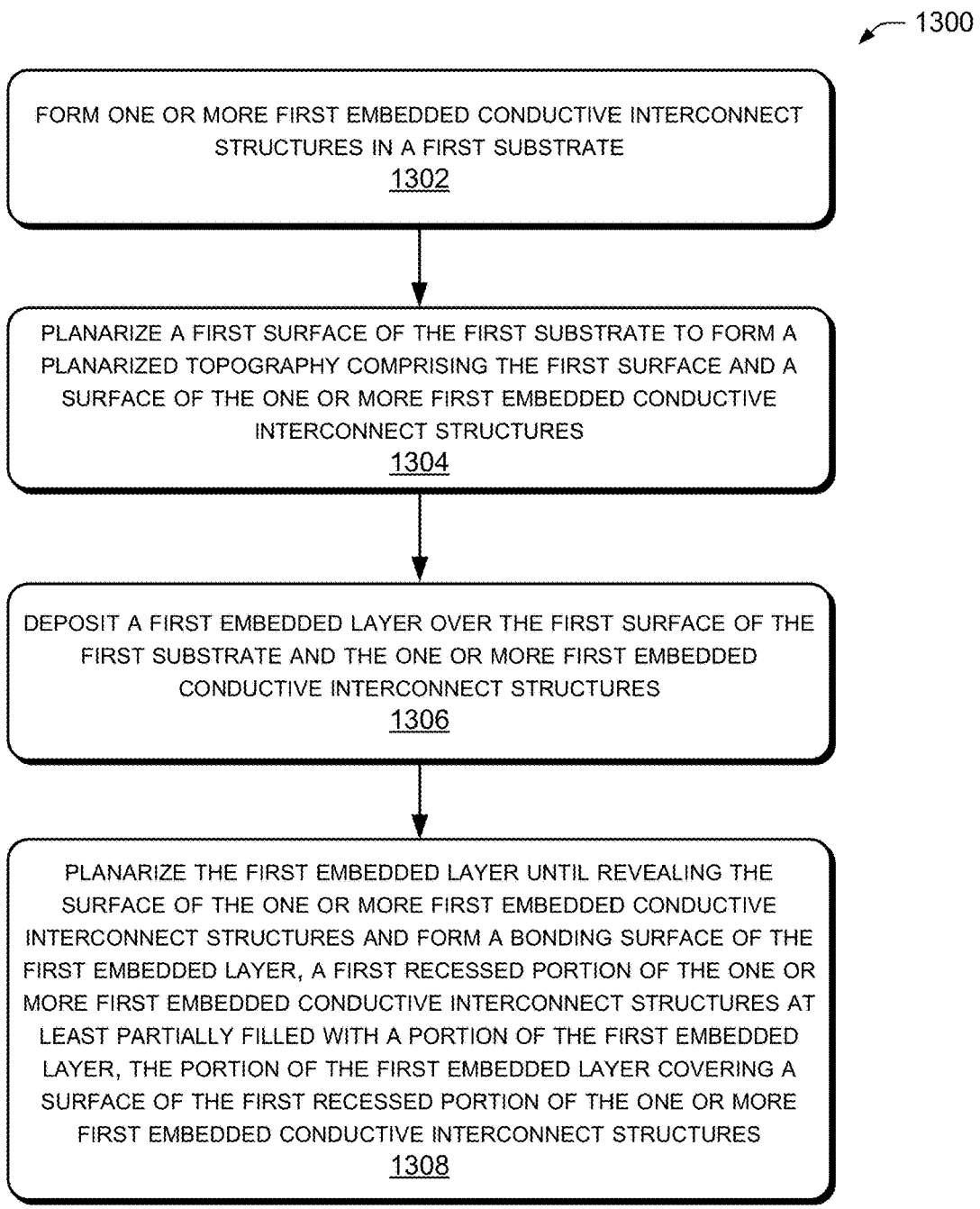
FIG. 13 is a text flow diagram illustrating an example process of forming a substrate having embedded conductive interconnect structures with openings, according to an embodiment.
Figure 14:
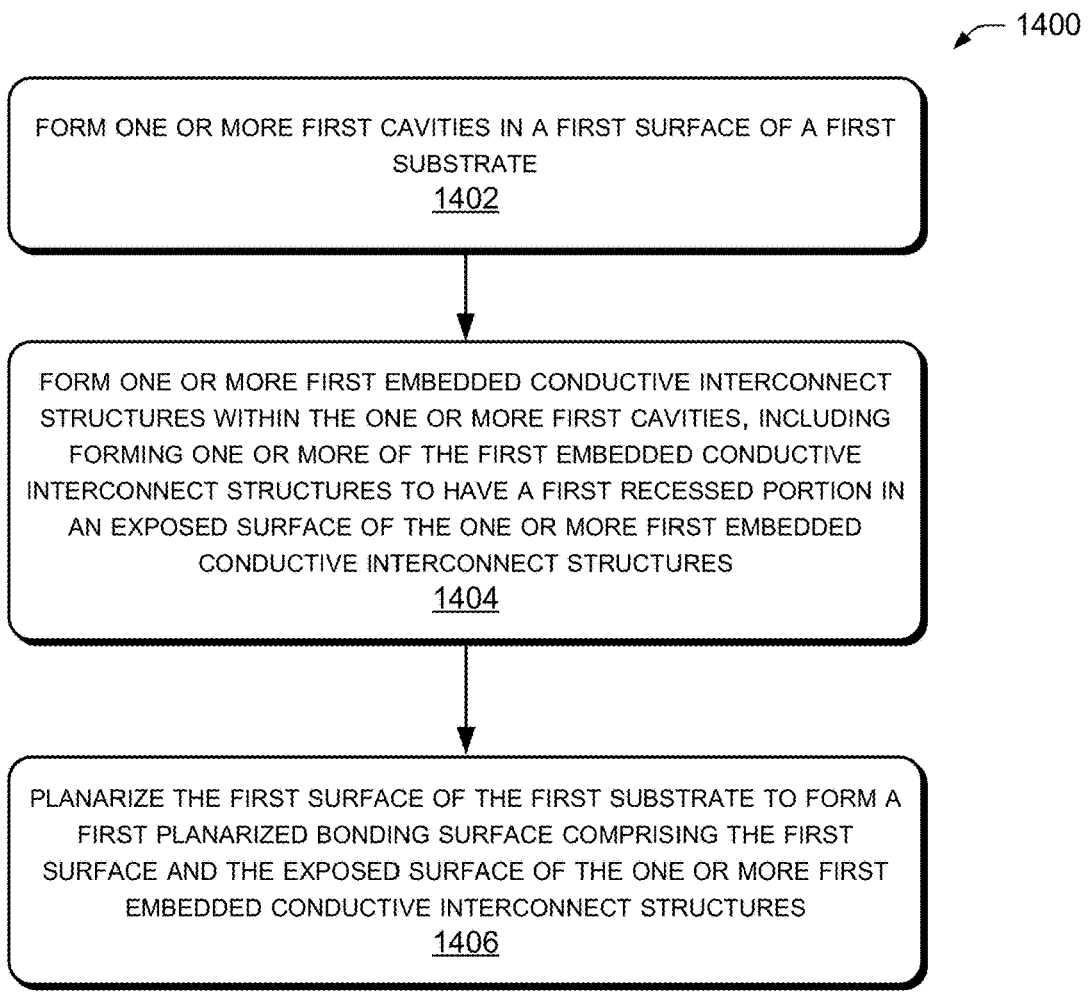
FIG. 14 is a flow diagram illustrating another example process of forming a substrate having embedded conducive interconnect statures, according to another embodiment.

FIGS. 13 and 14 comprise text-based process flows of the above described processes and techniques. Application of the process flows described provide for the use of larger width or diameter (e.g., 10 to 1000 microns, for example) conductive interconnect structures at the bonding surface of directly bonded dies, wafers, substrates, and the like.

The order in which the processes are described is not intended to be construed as limiting, and any number of the described process blocks in the processes can be combined in any order to implement the processes, or alternate processes. Additionally, individual blocks may be deleted from the processes without departing from the spirit and scope of the subject matter described herein. Furthermore, the processes can be implemented in any suitable hardware, software, firmware, or a combination thereof, without departing from the scope of the subject matter described herein. In alternate implementations, other techniques may be included in the processes in various combinations and remain within the scope of the disclosure.

FIG. 13 illustrates a representative process 1300 of mitigating undesirable recesses (such as recesses 116, for example) in the surface of conductive interconnect structures (such as conductive interconnect structures 114, for example) at the bonding surface of a die (such as die 302, for example), wafer, or other substrate of interest, according to various embodiments. For instance, an embedded layer (such as embedded layer 304, for example) may be formed in the recesses, filling the recesses to provide a flat and smooth bonding surface suitable for direct bonding. The process 1300 refers to FIGS. 1A-6.

In an implementation, at block 1302, the process 1300 includes forming one or more first embedded conductive interconnect structures (such as conductive interconnect structures 114, for example) in a first substrate (such as die 302, for example).

At block 1304, the process includes planarizing a first surface of the first substrate to form a planarized topography comprising the first surface and a surface of the one or more first embedded conductive interconnect structures. At block 1306, the process includes depositing a first embedded layer (such as embedded layer 304, for example) over the first surface of the first substrate and the one or more first embedded conductive interconnect structures.

At block 1308, the process includes planarizing the first embedded layer until revealing the surface of the one or more first embedded conductive interconnect structures and forming a bonding surface of the first embedded layer, a first recessed portion of the one or more first embedded conductive interconnect structures at least partially filled with a portion of the first embedded layer, the portion of the first embedded layer covering a surface of the first recessed portion of the one or more first embedded conductive interconnect structures.

In an implementation, the process includes suppressing a surface mobility of atoms of a material of the first recessed portion by covering the surface of the first recessed portion with the first embedded layer.

In an implementation, the process includes forming one or more second embedded conductive interconnect structures in a second substrate; planarizing a first surface of the second substrate to form a planarized topography comprising the first surface of the second substrate and a surface of the one or more second embedded conductive interconnect structures; bonding the first surface of the second substrate to the bonding surface of the first substrate via direct bonding without adhesive; and directly bonding the one or more second embedded conductive interconnect structures to the one or more first embedded conductive interconnect structures.

In a further implementation, the process includes depositing a second embedded layer over the first surface of the second substrate and the one or more second embedded conductive interconnect structures; and planarizing the second embedded layer until revealing the surface of the one or more second embedded conductive interconnect structures and forming a second bonding surface of the second bonding layer, a first recessed portion of the one or more second embedded conductive interconnect structures at least partially filled with a portion of the second embedded layer, the portion of the second embedded layer covering a surface of the first recessed portion of the one or more second embedded conductive interconnect structures.

In an implementation, the process further includes bonding the portion of the second embedded layer to the portion of the first embedded layer via direct bonding without adhesive.

As an alternate implementation, the process includes forming one or more first embedded conductive interconnect structures in a first substrate; planarizing a first surface of the first substrate to form a planarized topography comprising the first surface and a surface of the one or more first embedded conductive interconnect structures; selectively removing a portion of the first surface such that the one or more first embedded conductive interconnect structures protrudes above the first surface of the first substrate; depositing a first embedded layer over the first surface of the first substrate and the one or more first embedded conductive interconnect structures, the first embedded layer contacting a portion of a side wall of the one or more first embedded conductive interconnect structures; and planarizing the first embedded layer until revealing the surface of the one or more first embedded conductive interconnect structures and forming a bonding surface of the first embedded layer and the surface of the one or more first embedded conductive interconnect structures.

FIG. 14 illustrates a representative process 1400 of forming openings (such as openings 702, for example) in the surface of conductive interconnect structures (such as conductive interconnect structures 114, for example) at the bonding surface of a die (such as die 302, for example), wafer, or other substrate of interest, according to various embodiments. For instance, the openings may be formed in the conductive interconnect structures. The process 1400 refers to FIGS. 7A-12.

In an implementation, at block 1402, the process 1400 includes forming one or more first cavities in a first surface of a first substrate.

At block 1404, the process includes forming one or more first embedded conductive interconnect structures within the one or more first cavities, including forming one or more of the first embedded conductive interconnect structures to have a first recessed portion in an exposed surface of the one or more first embedded conductive interconnect structures.

In an implementation, the process includes forming the one or more first embedded conductive interconnect structures and the first recessed portion by partially filling the one or more first cavities using a damascene process. In an embodiment, the one or more first embedded conductive interconnect structures comprise a conformal metal coating over one or more interior surfaces of the one or more first cavities.

In an implementation, the process includes depositing a protective layer over the first recessed portion of the one or more first embedded conductive interconnect structures. In a further implementation, the process includes depositing one or more additional layers over the protective layer, at least one of the one or more additional layers including a dielectric material.

At block 1406, the process includes planarizing the first surface of the first substrate to form a first planarized bonding surface comprising the first surface and the exposed surface of the one or more first embedded conductive interconnect structures In an implementation, the process includes forming one or more second embedded conductive interconnect structures in a second substrate, including forming one or more of the second embedded conductive interconnect structures to have a second recessed portion in an exposed surface of the one or more second embedded conductive interconnect structures; planarizing a first surface of the second substrate to form a second planarized bonding surface comprising the first surface of the second substrate and the exposed surface of the one or more second embedded conductive interconnect structures; bonding the second planarized bonding surface of the second substrate to the first planarized bonding surface of the first substrate via direct bonding without adhesive; and directly bonding the one or more second embedded conductive interconnect structures to the one or more first embedded conductive interconnect structures.

In a further implementation, the process includes depositing a protective layer over the second recessed portion of the one or more second embedded conductive interconnect structures. In an example the process includes suppressing a surface mobility of atoms of a material of the second recessed portion by covering the surface of the second recessed portion with the protective layer. In another example the process includes controlling a direction of expansion of the material of the one or more second embedded conductive interconnect structures by covering the surface of the second recessed portion with the protective layer.

As an alternate implementation, the process includes forming one or more first cavities in a first surface of a first substrate; forming one or more first embedded conductive interconnect structures with one or more openings within the one or more first cavities; and forming a planar surface comprising one or more of the first embedded conductive interconnect structures having one or more openings.

As another alternate implementation, the process includes forming one or more first cavities in a first surface of a first substrate; forming one or more first embedded conductive interconnect structures with one or more openings within the one or more first cavities; forming a planar surface comprising one or more of the first embedded conductive interconnect structures having one or more openings; and directly bonding the planar surface of the interconnect structures with openings to the prepared surface of a second substrate.

In various embodiments, some process steps may be modified or eliminated, in comparison to the process steps described herein.

The techniques, components, and devices described herein are not limited to the illustrations of FIGS. 1A-15, and may be applied to other designs, types, arrangements, and constructions including with other electrical components without departing from the scope of the disclosure. In some cases, additional or alternative components, techniques, sequences, or processes may be used to implement the techniques described herein. Further, the components and/or techniques may be arranged and/or combined in various combinations, while resulting in similar or approximately identical results.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A microelectronic assembly, comprising:
   a first substrate having a bonding surface, the bonding surface of the first substrate having a planarized topography;
   first and second conductive interconnect structures embedded in the first substrate and exposed at the bonding surface of the first substrate, the second conductive interconnect structure having a larger surface area at the bonding surface than the first conductive interconnect structure;
   a first recessed portion disposed in a surface of the first conductive interconnect structure; and
   a second recessed portion disposed in a surface of the second conductive interconnect structure, the second recessed portion having a larger volume than the first recessed portion, the first recessed portion at least partially filled with a first portion of a first embedded layer, and the second recessed portion at least partially filled with a second portion of the first embedded layer, the first conductive interconnect structure being wider than the first portion of the first embedded layer and the second interconnect structure being wider than the second portion of the first embedded layer.

2. The microelectronic assembly of claim 1, further comprising a second substrate having a bonding surface, the bonding surface of the second substrate having a planarized topography and directly bonded to the bonding surface of the first substrate without an adhesive; and
   first and second conductive interconnect structures embedded in the second substrate and exposed at the bonding surface of the second substrate, the second conductive interconnect structure of the second substrate having a larger surface area at the bonding surface than the first conductive interconnect structure of the second substrate, the first conductive interconnect structure of the second substrate directly bonded to the first conductive interconnect structure of the first substrate and the second conductive interconnect structure of the second substrate directly bonded to the second conductive interconnect structure of the first substrate.

3. The microelectronic assembly of claim 2, further comprising a first recessed portion disposed in a surface of the first conductive interconnect structure of the second substrate and a second recessed portion disposed in a surface of the second conductive interconnect structure of the second substrate, the first and second recessed portions of the second substrate at least partially filled with a second embedded layer, the second embedded layer directly bonded to the first embedded layer without adhesive.

4. The microelectronic assembly of claim 3, wherein the first conductive interconnect structures of the first and second substrates form a first conductive interconnect and the second conductive interconnect structures of the first and second substrates form a second conductive interconnect, and wherein the first recessed portions of the first and second substrates form a first cavity within the first conductive interconnect and the second recessed portions of the first and second substrates form a second cavity within the second conductive interconnect, the first and second cavities fully lined with the second embedded layer and the first embedded layer.

5. The microelectronic assembly of claim 4, wherein the second cavity has a volume that is greater than a volume of the first cavity.

6. The microelectronic assembly of claim 2, wherein the second conductive interconnect structures of the first and second substrates have a surface width dimension greater than 5 microns.

7. The microelectronic assembly of claim 1, further comprising one or more cavities in the surface of the first and/or second conductive interconnect structures of the first substrate, within a perimeter of the first and/or second conductive interconnect structures of the first substrate, the one or more cavities filled with the first embedded layer.

8. The microelectronic assembly of claim 1, wherein the first embedded layer is comprised of a silicon-containing material.

9. The microelectronic assembly of claim 8, wherein the silicon-containing material comprises SiC, $SiC/SiO_2$, $SiN/SiO_2$, or a silicide.

10. The microelectronic assembly of claim 1, wherein the first embedded layer comprises a conductive material, the conductive material of the first embedded layer being different from a material of the first and second conductive interconnect structures.

11. The microelectronic assembly of claim 1, wherein a melting point or coefficient of thermal expansion (CTE) of a material of the first embedded layer is greater than a melting point or CTE of a material of the first conductive interconnect structure.

12. A microelectronic assembly, comprising:
   a first substrate having a bonding surface, the bonding surface of the first substrate having a planarized topography, a first conductive interconnect structure embedded in the first substrate with a first embedded layer on a portion of the bonding surface of the first conductive interconnect structure;
   a second substrate having a bonding surface, the bonding surface of the second substrate having a planarized topography, a second conductive interconnect structure embedded in the second substrate with a second embedded layer on a portion of the bonding surface of the second conductive interconnect structure;
   a bond interface at which the bonding surface of the first substrate is bonded to the bonding surface of the second substrate, the first and second embedded layers of the first and second substrates contacting and forming an enclosed cavity, a portion of the first conductive interconnect structure contacting a portion of the second conductive interconnect structure.

13. The microelectronic assembly of claim 12, wherein the first and second embedded layers are conformal to the first and second conductive interconnect structures, respectively.

14. The microelectronic assembly of claim 12, wherein the cavity extends more than 100 nm below the bond interface.

15. A microelectronic assembly, comprising:
   a first substrate having a bonding surface, the bonding surface of the first substrate having a planarized topography;

one or more first conductive interconnect structures embedded in the first substrate and exposed at the bonding surface of the first substrate;

a first recessed portion disposed in a surface of at least one of the one or more first conductive interconnect structures, wherein a depth of the first recessed portion is larger than 20 nm; and a portion of a protective layer disposed in the first recessed portion, the portion of the protective layer and a portion of the at least one of the one or more first conductive interconnect structures being exposed at the bonding surface.

16. The microelectronic assembly of claim 15, further comprising a second substrate having a bonding surface, the bonding surface of the second substrate having a planarized topography and directly bonded to the bonding surface of the first substrate without an adhesive; and one or more second conductive interconnect structures embedded in the second substrate and exposed at the bonding surface of the second substrate, the one or more second conductive interconnect structures directly bonded to the one or more first conductive interconnect structures.

17. The microelectronic assembly of claim 16, further comprising a second recessed portion disposed in a surface of at least one of the one or more second conductive interconnect structures, a volume of the second recessed portion corresponding to an expansion of a conductive material of the one or more second conductive interconnect structures when heated to a predetermined temperature.

18. The microelectronic assembly of claim 17, wherein the one or more second conductive interconnect structures and the one or more first conductive interconnect structures form one or more conductive interconnects, and wherein the first recessed portion and the second recessed portion form a cavity within at least one of the one or more conductive interconnects.

19. The microelectronic assembly of claim 18, wherein the cavity is partly or fully lined with the protective layer.

20. The microelectronic assembly of claim 19, wherein the protective layer contains silicon.

21. The microelectronic assembly of claim 20, wherein the protective layer is comprised of SiC, SiC/SiO$_2$, or SiN/SiO$_2$.

22. The microelectronic assembly of claim 21, wherein the one or more first conductive interconnect structures has a surface width dimension greater than 10 microns.

23. The microelectronic assembly of claim 19, wherein the protective layer is comprised of tungsten, an alloy of tungsten, nickel, a nickel alloy, cobalt, an alloy of cobalt, tantalum, an alloy of tantalum, titanium, or an alloy of titanium.

24. The microelectronic assembly of claim 19, further comprising a dielectric layer disposed over the protective layer.

25. The microelectronic assembly of claim 15, wherein the first recessed portion is disposed within a perimeter of the one or more first conductive interconnect structures.

26. The microelectronic assembly of claim 15, wherein the one or more first conductive interconnect structures comprise multiple conductive interconnect structures with different widths and/or surface areas at the bonding surface.

* * * * *